(12) United States Patent
Yoshii et al.

(10) Patent No.: US 12,512,418 B2
(45) Date of Patent: Dec. 30, 2025

(54) SEMICONDUCTOR DEVICE

(71) Applicant: ROHM CO., LTD., Kyoto (JP)

(72) Inventors: Yusuke Yoshii, Kyoto (JP); Yuki Inoue, Kyoto (JP); Hiroyuki Makimoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 849 days.

(21) Appl. No.: 17/780,362

(22) PCT Filed: Dec. 4, 2020

(86) PCT No.: PCT/JP2020/045225
§ 371 (c)(1),
(2) Date: May 26, 2022

(87) PCT Pub. No.: WO2021/117627
PCT Pub. Date: Jun. 17, 2021

(65) Prior Publication Data
US 2023/0011433 A1    Jan. 12, 2023

(30) Foreign Application Priority Data

Dec. 10, 2019   (JP) ................................. 2019-223029

(51) Int. Cl.
*H03F 3/45*    (2006.01)
*H01L 23/31*   (2006.01)
(Continued)

(52) U.S. Cl.
CPC ........ *H01L 23/552* (2013.01); *H01L 23/3107* (2013.01); *H01L 23/49513* (2013.01);
(Continued)

(58) Field of Classification Search
CPC ............... H01L 23/552; H01L 23/3107; H01L 23/49513; H01L 23/4952; H01L 23/5225;
(Continued)

(56) References Cited

U.S. PATENT DOCUMENTS

| 5,311,145 A | 5/1994 | Huijsing et al. |
| 7,480,153 B2 * | 1/2009 | Kong ................... H05K 9/0026 361/818 |

(Continued)

FOREIGN PATENT DOCUMENTS

| JP | H04179233 | 6/1992 |
| JP | H04369226 | 12/1992 |

(Continued)

OTHER PUBLICATIONS

International Search Report issued for International Patent Application No. PCT/JP2020/045225, Date of mailing: Feb. 22, 2021, 11 pages including English translation.

(Continued)

*Primary Examiner* — Hieu P Nguyen
(74) *Attorney, Agent, or Firm* — HSML P.C.

(57) ABSTRACT

A semiconductor device includes a semiconductor chip that has a main surface, a device region that is demarcated at the main surface, a differential amplifier that is formed in the device region and that amplifies and outputs a differential signal input to the differential amplifier, an insulation layer that covers the device region on the main surface, and a shield electrode that is incorporated in the insulation layer such as to conceal the device region in a plan view and that is fixed to a ground potential.

20 Claims, 16 Drawing Sheets

(51) Int. Cl.
  *H01L 23/495* (2006.01)
  *H01L 23/552* (2006.01)
  *H03F 1/52* (2006.01)

(52) U.S. Cl.
  CPC ......... *H01L 23/4952* (2013.01); *H03F 1/523* (2013.01); *H03F 3/45269* (2013.01); *H03F 3/45273* (2013.01); *H03F 2200/114* (2013.01)

(58) Field of Classification Search
  CPC .. H03F 1/523; H03F 3/45269; H03F 3/45273; H03F 2200/114; H03F 2200/451; H03F 3/195; H03F 3/30; H03F 3/303; H03F 3/4521; H03F 3/45475
  USPC .......................................... 330/307, 252–261
  See application file for complete search history.

(56) References Cited

U.S. PATENT DOCUMENTS

| | | | | |
|---|---|---|---|---|
| 8,860,440 | B2 * | 10/2014 | Balachandran | G01R 27/2605 324/672 |
| 9,713,255 | B2 * | 7/2017 | Elsherbini | H01L 23/49833 |
| 2006/0066400 | A1 | 3/2006 | Kang et al. | |
| 2016/0365317 | A1 * | 12/2016 | Keigler | H01L 23/552 |
| 2019/0164918 | A1 | 5/2019 | Shindo | |

FOREIGN PATENT DOCUMENTS

| | | |
|---|---|---|
| JP | H0555380 | 3/1993 |
| JP | H06326529 | 11/1994 |
| JP | 2003133421 | 5/2003 |
| JP | 2005064411 A | 3/2005 |
| JP | 2006025039 | 1/2006 |
| JP | 2006094533 | 4/2006 |
| JP | 2008034676 | 2/2008 |
| JP | 2019102522 | 6/2019 |

OTHER PUBLICATIONS

Written Opinion issued for International Patent Application No. PCT/JP2020/045225, Date of mailing: Feb. 22, 2021, 8 pages including English machine translation.

Notice of Reasons for Refusal issued for Japanese Patent Application No. 2021-563917, Dispatch date: Jan. 9, 2025, 6 pages including English machine translation.

Decision of Refusal issued for Japanese Patent Application No. 2021-563917, Dispatch date: May 8, 2025, 6 pages including English machine translation.

First Office Action issued for Chinese Patent Application No. 202080085272.X, dated May 14, 2025, 15 pages including English machine translation.

* cited by examiner

130

130

SEMICONDUCTOR DEVICE

TECHNICAL FIELD

The present invention relates to a semiconductor device to which a differential signal is input.

BACKGROUND ART

Patent Literature 1 discloses a differential amplifier circuit including a cascode class-AB control end.

CITATION LIST

Patent Literature

Patent Literature 1: Japanese Patent Application Publication No. 2006-94533

SUMMARY OF INVENTION

Technical Problem

In a semiconductor device to which a differential signal is input, excellent electromagnetic interference (EMI) immunity is required from the viewpoint of restraining a noise, a malfunction, or the like that is caused by electromagnetic waves from the outside. Electromagnetic interference signals, such as radio frequency (RF) signals that are outside operating-frequency bands, can be mentioned as the electromagnetic waves from the outside.

An embodiment of the present invention provides a semiconductor device that is capable of improving EMI immunity in a structure in which a differential signal is input.

Solution to Problem

An embodiment of the present invention provides a semiconductor device that includes a semiconductor chip that has a main surface, a device region that is demarcated at the main surface, a differential amplifier that is formed in the device region and that amplifies and outputs a differential signal input to the differential amplifier, and a shield electrode that is arranged on the main surface such as to conceal the device region in a plan view and that is fixed to a ground potential. With this semiconductor device, it is possible to raise EMI immunity.

An embodiment of the present invention provides a semiconductor device that includes a semiconductor chip that has a main surface, a constant current region that is demarcated at the main surface, an input region that is demarcated at the main surface, a constant current circuit that is formed in the constant current region and that generates a constant current, a differential circuit that is formed in the input region, that is electrically connected to the constant current circuit, and that transforms a differential signal input to the differential circuit into a differential current, and a shield electrode that is arranged on the main surface such as to conceal at least either one of the input region and the constant current region in a plan view and that is fixed to a ground potential. With this semiconductor device, it is possible to raise EMI immunity.

The aforementioned or still other objects, features, and effects of the present invention will be clarified by the following description of embodiments given below with reference to the accompanying drawings.

DESCRIPTION OF EMBODIMENTS

Figure 1:
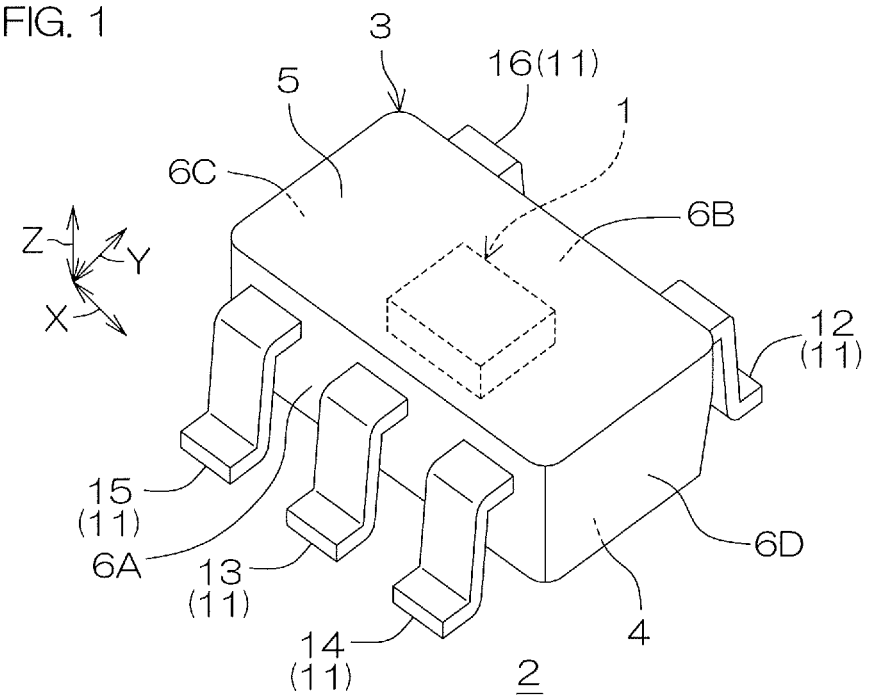
FIG. 1 is a perspective view showing a semiconductor package in which a semiconductor device according to a first embodiment of the present invention is incorporated.
Figure 2:
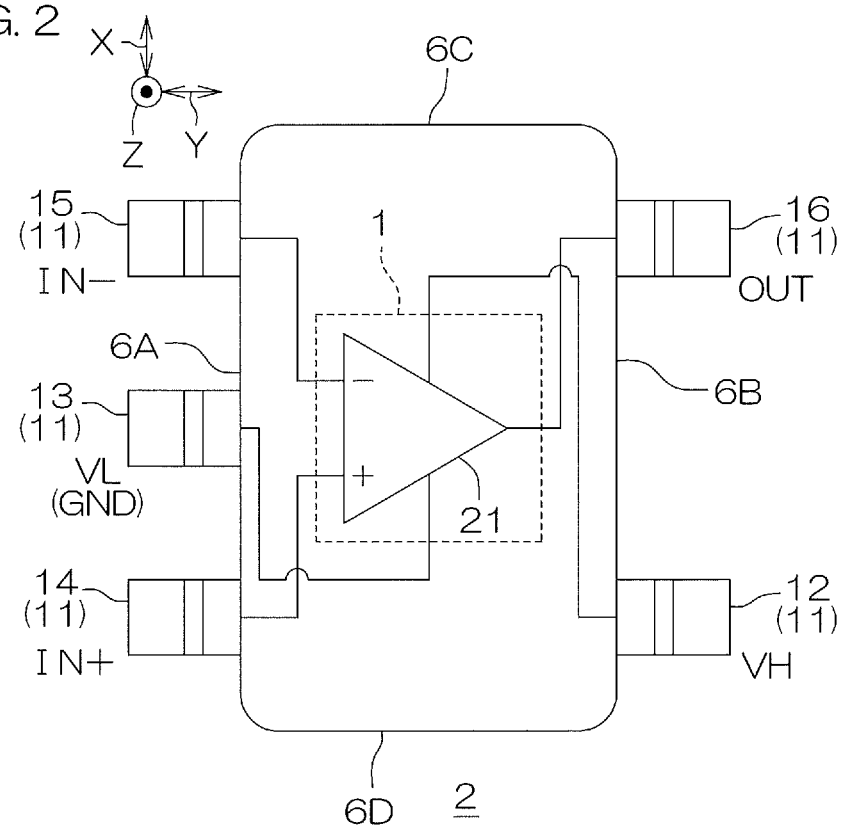
FIG. 2 is a view in which an electric structure of the semiconductor package shown in FIG. 1 is represented by circuit symbols.
Figure 3:
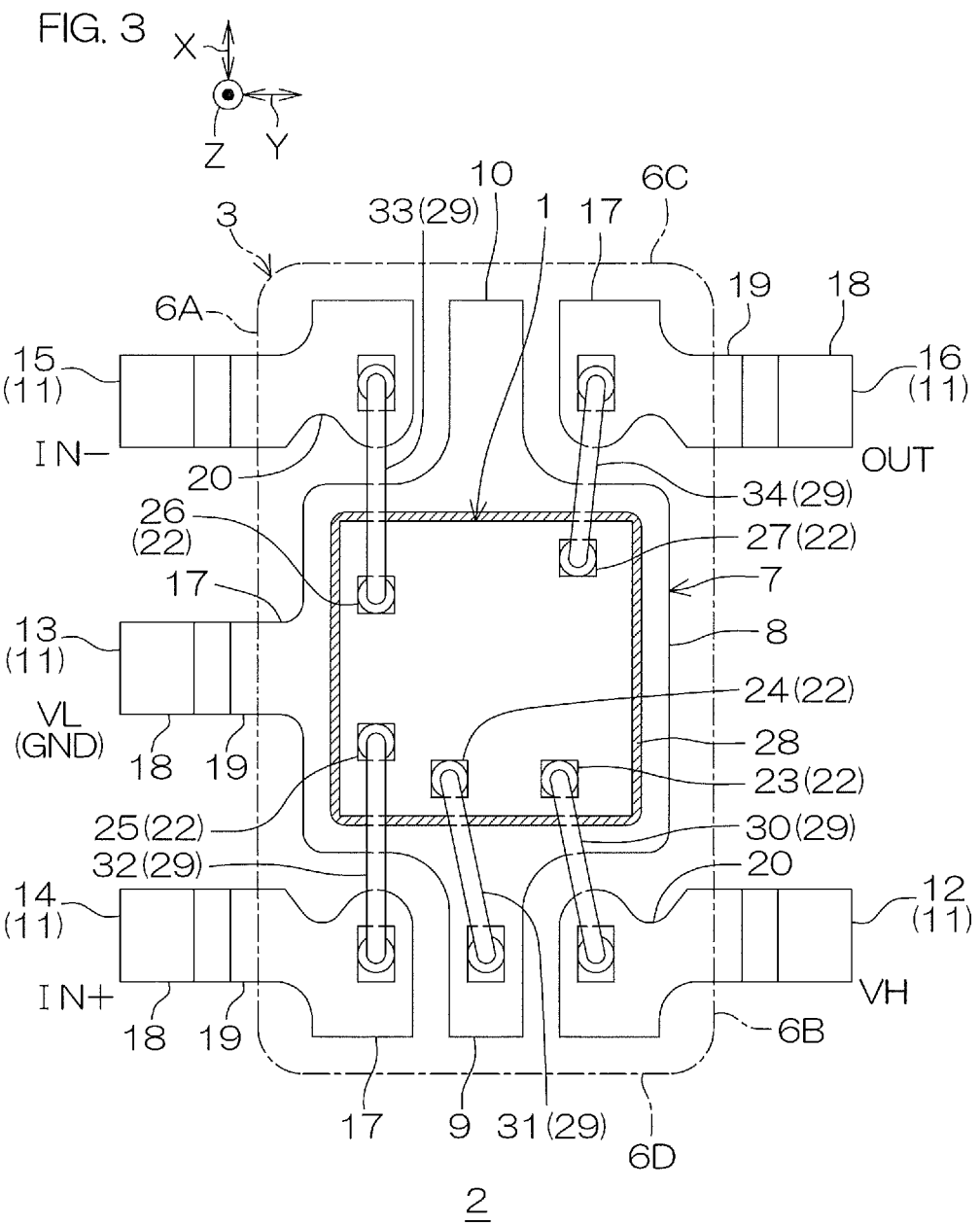
FIG. 3 is a plan view showing an internal structure of the semiconductor package shown in FIG. 1.

FIG. 1 is a perspective view showing a semiconductor package 2 in which a semiconductor device 1 according to a first embodiment of the present invention is incorporated. FIG. 2 is a view in which the semiconductor package 2 shown in FIG. 1 is represented by circuit symbols. FIG. 3 is a plan view showing an internal structure of the semiconductor package 2 shown in FIG. 1.

Referring to FIG. 1 to FIG. 3, the semiconductor package 2 consists of a five-terminal type SOP (Small Outline Package) in this embodiment. Without being limited to the SOP, the semiconductor package 2 may consist of a QFN (Quad For Non Lead Package), a DFP (Dual Flat Package), a DIP (Dual Inline Package), a QFP (Quad Flat Package), an SIP (Single Inline Package), or an SOJ (Small Outline J-leaded Package), or may consist of various packages similar to these packages.

The semiconductor package 2 includes a package body 3. The package body 3 is made of a molding resin (for example, epoxy resin), and is formed into a rectangular parallelepiped shape. The package body 3 has a mounting surface 4 on one side, a non-mounting surface 5 on the other side, and first to fourth sidewalls 6A to 6D by which the mounting surface 4 and the non-mounting surface 5 are connected together. The mounting surface 4 and the non-mounting surface 5 are each formed in a quadrangular shape (in detail, a rectangular shape) in a plan view seen from their normal directions Z. The mounting surface 4 is a surface facing a to-be-connected object, to which the semiconductor package 2 is connected, in a state in which the semiconductor package 2 has been mounted on the to-be-connected object. A circuit board, such as a printed circuit board (PCB), can be mentioned as an example of the to-be-connected object.

The first to fourth sidewalls 6A to 6D include a first sidewall 6A, a second sidewall 6B, a third sidewall 6C, and a fourth sidewall 6D. The first sidewall 6A and the second sidewall 6B extend along a first direction X, and face a second direction Y perpendicular to the first direction X. The first sidewall 6A and the second sidewall 6B form long sides of the package body 3. The third sidewall 6C and the fourth sidewall 6D extend along the second direction Y, and face the first direction X. The third sidewall 6C and the fourth sidewall 6D form short sides of the package body 3. The length of the long side of the package body 3 may be not less than 2 mm and not more than 5 mm. The length of the short side of the package body 3 may be not less than 1 mm and not more than 4 mm.

The semiconductor package 2 includes a plate-shaped die pad 7 arranged in the package body 3. The die pad 7 is arranged on the mounting-surface-4 side in the package body 3. The die pad 7 may be used also as a shield plate that intercepts electromagnetic waves from the outside. The die pad 7 includes at least one among copper, a copper-base alloy, iron, and an iron-base alloy. The die pad 7 includes a pad body 8, a first drawn portion 9, and a second drawn portion 10.

The pad body 8 is formed in a quadrangular shape in a plan view. The first drawn portion 9 is drawn out in a belt shape from a side, which is along the fourth sidewall 6D, of the pad body 8 toward the fourth sidewall 6D in a plan view. The second drawn portion 10 is drawn out in a belt shape from a side, which is along the third sidewall 6C, of the pad body 8 toward the third sidewall 6C in a plan view. The shape of the die pad 7 is arbitrary, and the first and second drawn portions 9 and 10 are not necessarily required to be formed. A die pad 7 that does not have either one or both of the first and second drawn portions 9 and 10 may be employed.

The semiconductor package 2 includes a plurality of (in this embodiment, five) lead terminals 11 drawn outwardly from the inside of the package body 3. The lead terminals 11 are bent toward the mounting-surface-4 side outside the package body 3. Each of the lead terminals 11 includes at least one among copper, a copper-base alloy, iron, and an iron-base alloy. In detail, the lead terminals include a high-potential lead terminal 12, a low-potential lead terminal 13, a non-inverting input lead terminal 14, an inverting input lead terminal 15, and an output lead terminal 16.

The high-potential lead terminal 12 and the low-potential lead terminal 13 are power lead terminals in which a reference potential is applied to the low-potential lead terminal 13. In detail, the low-potential lead terminal 13 is a ground lead terminal fixed to the ground potential.

The inverting input lead terminal 15, the low-potential lead terminal 13, and the non-inverting input lead terminal 14 are arranged on the first-sidewall-6A side with an interval between each other in this order from the third-sidewall-6C side toward the fourth-sidewall-6D side. The output lead terminal 16 and the high-potential lead terminal are arranged on the second-sidewall-6B side with an interval between each other in this order from the third-sidewall-6C side toward the fourth-sidewall-6D side. The output lead terminal 16 faces the inverting input lead terminal 15 with the package body 3 interposed between the output lead terminal 16 and the inverting input lead terminal 15. The high-potential lead terminal 12 faces the non-inverting input lead terminal 14 with the package body 3 interposed between the high-potential lead terminal 12 and the non-inverting input lead terminal 14.

Each of the lead terminals 11 has an inner end portion 17, an outer end portion 18, and a lead portion 19. The inner end portion 17 is placed inside the package body 3, and has a plate surface parallel to the mounting surface 4 (non-mounting surface 5). Each of the inner end portions 17 of the lead terminals 11 arranged at four corners has a curved portion 20 that is hollowed in a direction away from the die pad 7 in a part, which faces this die pad 7, of the inner end portion 17. The inner end portion 17 of the low-potential lead terminal 13 is formed integrally with the die pad 7, and fixes the die pad 7 to the same electric potential.

The outer end portion 18 is placed outside the package body 3, and has a plate surface parallel to the mounting surface 4 (non-mounting surface 5). The lead portion 19 is drawn outwardly from the inner end portion 17 and outwardly from the package body 3, and is connected to the outer end portion 18. The lead portion 19 is bent toward the mounting-surface-4 side outside the package body 3, and is connected to the outer end portion 18 at a height position at which the mounting surface 4 is crossed in the normal direction Z.

The lead terminals 11 are arbitrary in shape. Also, the high-potential lead terminal 12, the low-potential lead terminal 13, the non-inverting input lead terminal 14, the inverting input lead terminal 15, and the output lead terminal 16 are arbitrary in disposition, and the disposition of these terminals is not limited to the disposition shown in FIG. 1 to FIG. 2.

The semiconductor package 2 includes the semiconductor device 1 arranged on the die pad 7 (in detail, the pad body 8) in the package body 3. The semiconductor device 1 is arranged on the non-mounting-surface-5 side with respect to the die pad 7 in the package body 3. The semiconductor device 1 includes a differential amplifier 21 that amplifies a differential signal input thereto and then outputs the resulting signal and a plurality of terminals 22 electrically connected to the differential amplifier 21. The differential amplifier 21 is formed inside the semiconductor device 1. The terminals 22 are formed on a surface, which is one of two surfaces, of the semiconductor device 1. The semiconductor device 1 is arranged on a plate surface on the non-mounting-surface-5 side of the die pad 7 (in detail, the pad body 8) in a posture in which the terminals 22 are allowed to face the non-mounting surface 5 of the package body 3.

In this embodiment, the semiconductor device 1 is a single channel type that includes one differential amplifier 21. The terminals 22 include a high-potential terminal 23, a low-potential terminal 24, a non-inverting input terminal 25, an inverting input terminal 26, and an output terminal 27. The high-potential terminal 23 and the low-potential terminal 24 are power terminals in which a reference potential is applied to the low-potential terminal 24. In detail, the low-potential terminal 24 is a ground terminal fixed to the ground potential.

The semiconductor package 2 includes a conductive joining material 28 that is interposed between the die pad 7 and the semiconductor device 1 in the package body 3 and that joins the die pad 7 and the semiconductor device 1 together (see the hatching portion of FIG. 3). The conductive joining material 28 is an insulation adhesive, a metallic adhesive, or a solder.

The semiconductor package 2 includes a plurality of (in this embodiment, five) lead wires 29 each of which electrically connects each of the terminals 22 of the semiconductor device 1 to a corresponding lead terminal 11 in the package body 3. Each of the lead wires 29 is a bonding wire. The lead wires 29 include at least one among copper wires, gold wires, and aluminum wires.

In detail, the lead wires 29 include a high-potential lead wire 30, a low-potential lead wire 31, a non-inverting input lead wire 32, an inverting input lead wire 33, and an output lead wire 34. The high-potential lead wire 30 is connected to the high-potential lead terminal 12 and to the high-potential terminal 23. The low-potential lead wire 31 is connected to the die pad 7 (the first drawn portion 9) and to the low-potential terminal 24, and electrically connects the low-potential lead terminal 13 and the low-potential terminal 24 to each other through the die pad 7. The non-inverting input lead wire 32 is connected to the non-inverting input lead terminal 14 and to the non-inverting input terminal 25. The inverting input lead wire 33 is connected to the inverting input lead terminal 15 and to the inverting input terminal 26. The output lead wire 34 is connected to the output lead terminal 16 and to the output terminal 27.

Figure 4:
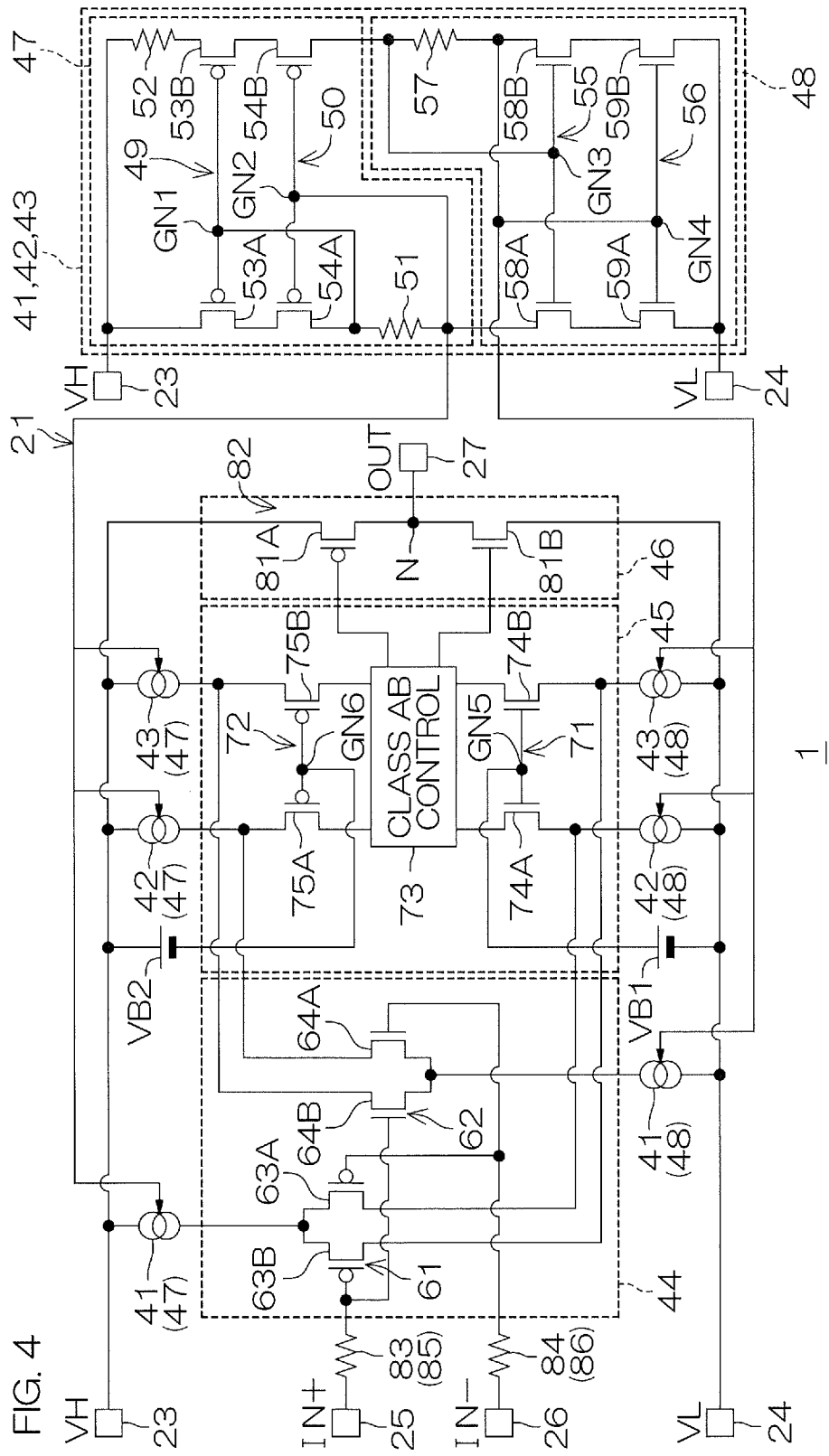
FIG. 4 is an electric circuit diagram showing an electric structure of the semiconductor device shown in FIG. 3.

FIG. 4 is an electric circuit diagram showing an electric structure of the semiconductor device 1 shown in FIG. 3. The semiconductor device 1 includes the differential amplifier 21. The differential amplifier 21 is connected to the high-potential terminal 23, to the low-potential terminal 24, to the non-inverting input terminal 25, to the inverting input terminal 26, and to the output terminal 27, and amplifies a differential signal input thereto and then outputs the resulting signal. In this embodiment, the differential amplifier 21 is a Rail-to-Rail output type class-AB amplifier in which a potential difference between the non-inverting input terminal 25 and the inverting input terminal 26 works within the range of a potential difference between the high-potential terminal 23 and the low-potential terminal 24.

The differential amplifier 21 includes a plurality of (in this embodiment, three) constant current circuits 41 to 43, an input circuit 44, an amplifier circuit 45, and an output circuit 46. The constant current circuits 41 to 43, the input circuit 44, the amplifier circuit 45, and the output circuit 46 may be referred to as a constant current stage, an input stage, an amplifier stage, and an output stage, respectively. Also, the constant current circuits 41 to 43, the input circuit 44, and the amplifier circuit 45 may be collectively referred to as a differential amplifier circuit (differential amplifier stage).

In detail, the constant current circuits 41 to 43 include a first constant current circuit 41, a second constant current circuit 42, and a third constant current circuit 43. The constant current circuits 41 to 43 have the same arrangement, and therefore the constant current circuits 41 to 43 are shown by the single circuit diagram on the right-hand side in the plane of paper of FIG. 4.

Each of the constant current circuits 41 to 43 is interposed between the high-potential terminal 23 and the low-potential terminal 24, and generates a constant current. In this embodiment, each of the constant current circuits 41 to 43 consists of a self-bias type cascode current mirror circuit. In detail, each of the constant current circuits 41 to 43 integrally includes a first constant current generation circuit 47 that generates a first constant current on the high-potential-terminal-23 side and a second constant current generation circuit 48 that generates a second constant current on the low-potential-terminal-24 side.

In detail, the first constant current generation circuit 47 includes a first current mirror circuit 49, a second current mirror circuit 50, a first resistance 51, and a second resistance 52. The first constant current generation circuit 47 is configured to allow the first current mirror circuit 49 and the second current mirror circuit 50 to perform a two-stage operation by means of the first resistance 51.

The first current mirror circuit 49 includes a pair of first constant current transistors 53A and 53B. The first constant current transistors 53A and 53B are p-type (first polar type) field-effect transistors or p-type bipolar transistors (in FIG. 4, field-effect transistors), respectively. The field-effect transistor may consist of a part of a CMOS transistor.

Gates of the first constant current transistors 53A and 53B are connected together, and form a first gate node GN1. Sources of the first constant current transistors 53A and 53B are each connected to the high-potential terminal 23.

The second current mirror circuit 50 includes a pair of second constant current transistors 54A and 54B, and is cascode-connected to the first current mirror circuit 49. The second constant current transistors 54A and 54B are p-type field-effect transistors or p-type bipolar transistors (in FIG. 4, field-effect transistors), respectively. The field-effect transistor may consist of a part of a CMOS transistor.

Gates of the second constant current transistors 54A and 54B are connected together, and form a second gate node GN2. A source of the second constant current transistor 54A is connected to a drain of the first constant current transistor 53A. A source of the second constant current transistor 54B is connected to a drain of the first constant current transistor 53B.

The first resistance 51 is connected to a drain of the second constant current transistor 54A. In detail, an end of the first resistance 51 is connected to the drain of the second constant current transistor 54A and to the first gate node GN1 of the first current mirror circuit 49. The other end of the first resistance 51 is connected to the second gate node GN2 of the second current mirror circuit 50. The second resistance 52 is interposed between the high-potential terminal 23 and the source of the first constant current transistor 53B.

In detail, the second constant current generation circuit 48 includes a third current mirror circuit 55, a fourth current mirror circuit 56, and a third resistance 57. The second constant current generation circuit 48 is configured to allow the third current mirror circuit 55 and the fourth current mirror circuit 56 to perform a two-stage operation by means of the third resistance 57.

The third current mirror circuit 55 includes a pair of third constant current transistors 58A and 58B. The third constant current transistors 58A and 58B are n-type (second polar type) field-effect transistors or n-type bipolar transistors (in FIG. 4, field-effect transistors), respectively. The field-effect transistor may consist of a part of a CMOS transistor.

Gates of the third constant current transistors 58A and 58B are connected together, and form a third gate node GN3. A drain of the third constant current transistor 58A is connected to the other end of the first resistance 51, and is connected to the drain of the second constant current transistor 54A through the first resistance 51. A drain of the third constant current transistor 58B is connected to a drain of the second constant current transistor 54B.

The fourth current mirror circuit 56 includes a pair of fourth constant current transistors 59A and 59B, and is cascode-connected to the third current mirror circuit 55. The fourth constant current transistors 59A and 59B are n-type field-effect transistors or n-type bipolar transistors (in FIG. 4, field-effect transistors), respectively. The field-effect transistor may consist of a part of a CMOS transistor.

Gates of the fourth constant current transistors 59A and 59B are connected together, and form a fourth gate node GN4. A drain of the fourth constant current transistor 59A is connected to a source of the third constant current transistor 58A. A drain of the fourth constant current transistor 59B is connected to a source of the third constant current transistor 58B. Sources of the fourth constant current transistors 59A and 59B are each connected to the low-potential terminal 24.

The third resistance 57 is interposed between the drain of the second constant current transistor 54B and the drain of the third constant current transistor 58B. In detail, an end of the third resistance 57 is connected to the drain of the second constant current transistor 54B and to the third gate node GN3 of the third current mirror circuit 55. The other end of the third resistance 57 is connected to the drain of the third constant current transistor 58B and to the fourth gate node GN4 of the fourth current mirror circuit 56.

The input circuit 44 is connected to the non-inverting input terminal 25, to the inverting input terminal 26, and to the first constant current circuit 41. The input circuit 44 transforms a differential signal, which has been input to the non-inverting input terminal 25 and to the inverting input terminal 26, into a differential current.

In detail, the input circuit 44 includes a first differential circuit 61 and a second differential circuit 62.

The first differential circuit 61 works within a first differential voltage range in which the second differential circuit 62 does not work, whereas the second differential circuit 62 works in a second differential voltage range in which the first differential circuit 61 does not work. The input circuit 44 is configured so that this method allows a differential voltage between the non-inverting input terminal 25 and the inverting input terminal 26 works within a voltage range between the high-potential terminal 23 and the low-potential terminal 24.

In detail, the first differential circuit 61 includes a pair of first differential transistors 63A and 63B forming a differential connection. The first differential transistors 63A and 63B are p-type field-effect transistors or p-type bipolar transistors (in FIG. 4, field-effect transistors), respectively. The field-effect transistor may consist of a part of a CMOS transistor.

A gate of the first differential transistor 63A is connected to the inverting input terminal 26. A gate of the first differential transistor 63B is connected to the non-inverting input terminal 25. Sources of the first differential transistors 63A and 63B are connected to the first constant current generation circuit 47 of the first constant current circuit 41, which serves as a constant current source. Drains of the first differential transistors 63A and 63B are connected to the amplifier circuit 45.

In detail, the second differential circuit 62 includes a pair of second differential transistors 64A and 64B forming a differential connection. The second differential transistors 64A and 64B are n-type field-effect transistors or n-type bipolar transistors (in FIG. 4, field-effect transistors), respectively. The field-effect transistor may consist of a part of a CMOS transistor.

A gate of the second differential transistor 64A is connected to the inverting input terminal 26. A gate of the second differential transistor 64B is connected to the non-inverting input terminal 25. Sources of the second differential transistors 64A and 64B are connected to the second constant current generation circuit 48 of the first constant current circuit 41, which serves as a constant current source. Drains of the second differential transistors 64A and 64B are connected to the amplifier circuit 45.

The amplifier circuit 45 is connected to the high-potential terminal 23, to the low-potential terminal 24, to the second constant current circuit 42, to the third constant current circuit 43, and to the input circuit 44. The amplifier circuit 45 amplifies a differential current generated by the input circuit 44, and generates an amplification current. In detail, the amplifier circuit 45 includes a first current return circuit 71, a second current return circuit 72, and a class-AB control circuit 73.

The first current return circuit 71 forms a first folded cascode circuit with the first differential circuit 61, and amplifies a differential current in cooperation with the first differential circuit 61. The second current return circuit 72 forms a second folded cascode circuit with the second differential circuit 62, and amplifies a differential current in cooperation with the second differential circuit 62.

The first current return circuit 71 includes a pair of first bias transistors 74A and 74B forming a cascode connection with the first differential circuit 61. The first bias transistors 74A and 74B are n-type field-effect transistors or n-type bipolar transistors (in FIG. 4, field-effect transistors), respectively. The field-effect transistor may consist of a part of a CMOS transistor.

Gates of the first bias transistors 74A and 74B are connected together, and form a fifth gate node GN5. A source of the first bias transistor 74A is connected to a drain of the first differential transistor 63A and to the second constant current generation circuit 48 of the second constant current circuit 42, which serves as a constant current source.

A source of the first bias transistor 74B is connected to a drain of the first differential transistor 63B and to the second constant current generation circuit 48 of the third constant current circuit 43, which serves as a constant current source. The first current return circuit 71 is controlled by a first bias voltage source VB1 interposed between the low-potential terminal 24 and the fifth gate node GN5.

The second current return circuit 72 includes a pair of second bias transistors 75A and 75B forming a cascode connection with the second differential circuit 62. The second bias transistors 75A and 75B are p-type field-effect transistors or p-type bipolar transistors (in FIG. 4, field-effect transistors), respectively. The field-effect transistor may consist of a part of a CMOS transistor.

Gates of the second bias transistors 75A and 75B are connected together, and form a sixth gate node GN6. A source of the second bias transistor 75A is connected to a drain of the second differential transistor 64A and to the first constant current generation circuit 47 of the second constant current circuit 42, which serves as a constant current source.

A source of the second bias transistor 75B is connected to a drain of the second differential transistor 64B and to the first constant current generation circuit 47 of the third constant current circuit 43, which serves as a constant current source. The second current return circuit is controlled by a second bias voltage source VB2 interposed between the high-potential terminal 23 and the sixth gate node GN6.

The class-AB control circuit 73 is connected to drains of the first bias transistors 74A and 74B and to drains of the second bias transistors 75A and 75B. The class-AB control circuit 73 generates a class-AB control signal according to an amplification current generated by the first current return circuit 71 and a class-AB control signal according to an amplification current generated by the second current return circuit 72, and outputs these signals.

The output circuit 46 is connected to the high-potential terminal 23, to the low-potential terminal 24, to the output terminal 27, and to the amplifier circuit 45. The output circuit 46 responds to a class-AB control signal generated by the amplifier circuit 45 (the class-AB control circuit 73), and then generates an output current according to an amplification current, and outputs this output current to the output terminal 27.

In detail, the output circuit 46 includes a push-pull circuit 82 including a pair of output transistors 81A and 81B forming a push-pull connection. The output transistor 81A is a p-type field-effect transistor or a p-type bipolar transistor (in FIG. 4, a field-effect transistor). The output transistor 81B is an n-type field-effect transistor or an n-type bipolar transistor (in FIG. 4, a field-effect transistor). The field-effect transistor may consist of a part of a CMOS transistor.

A gate of the output transistor 81A is connected to the class-AB control circuit 73, and is controlled by a class-AB control signal sent from the class-AB control circuit 73. A source of the output transistor 81A is connected to the high-potential terminal 23. A gate of the output transistor 81B is connected to the class-AB control circuit 73, and is controlled by a class-AB control signal sent from the class-AB control circuit 73. A source of the output transistor 81B is connected to the low-potential terminal 24. A drain of the output transistor 81B is connected to a drain of the output transistor 81A, and forms an output node N. The output node N is connected to the output terminal 27.

In this embodiment, the differential amplifier 21 further includes a first low-pass filter circuit 83 and a second low-pass filter circuit 84. The first low-pass filter circuit 83 includes a fourth resistance 85, and is interposed between the non-inverting input terminal 25 and the first differential circuit 61. The second low-pass filter circuit 84 includes a fifth resistance 86, and is interposed between the inverting input terminal 26 and the second differential circuit 62.

Figure 5:
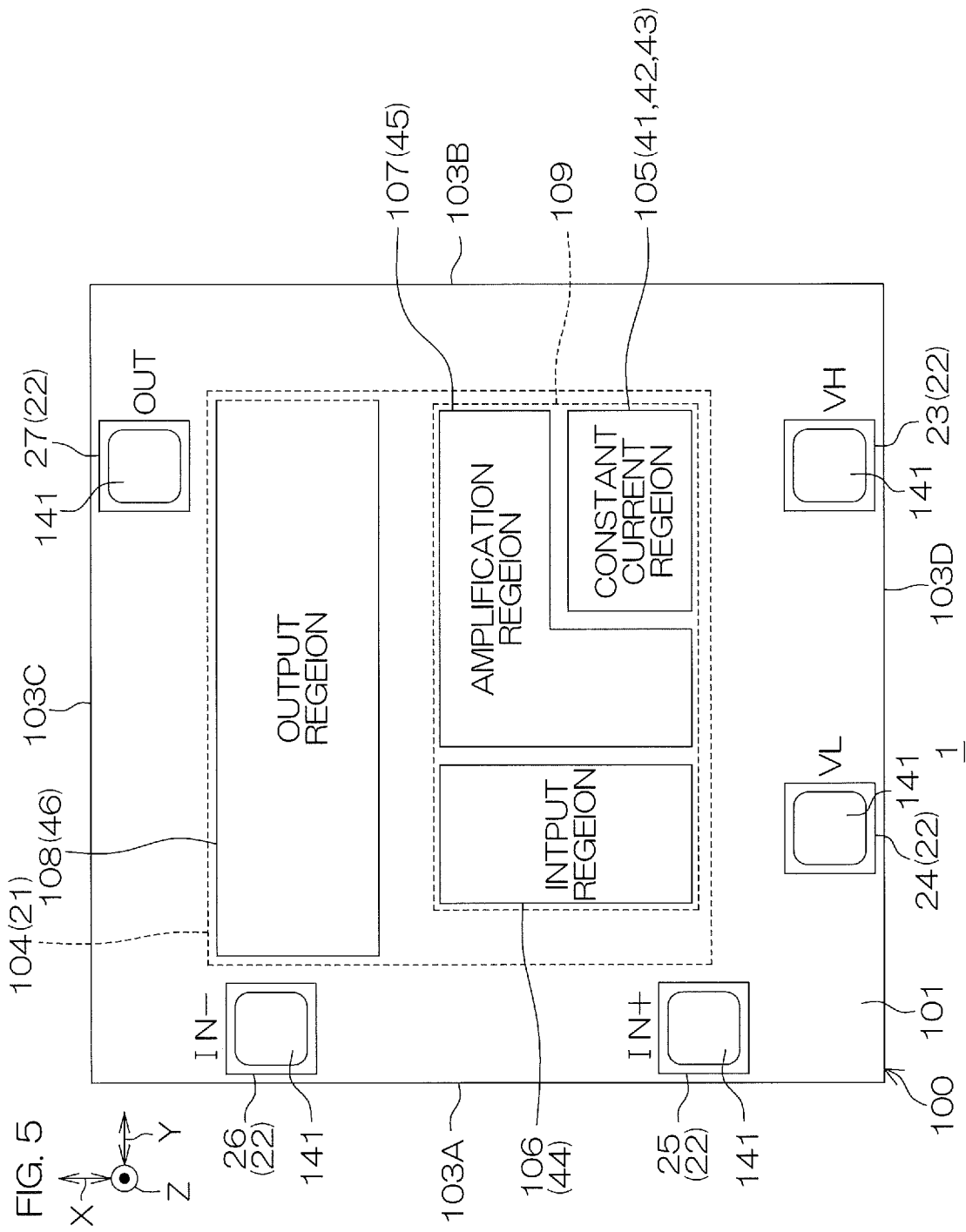
FIG. 5 is a plan view in which the layout of an internal structure of the semiconductor device shown in FIG. 3 is shown by a block diagram.
Figure 6:
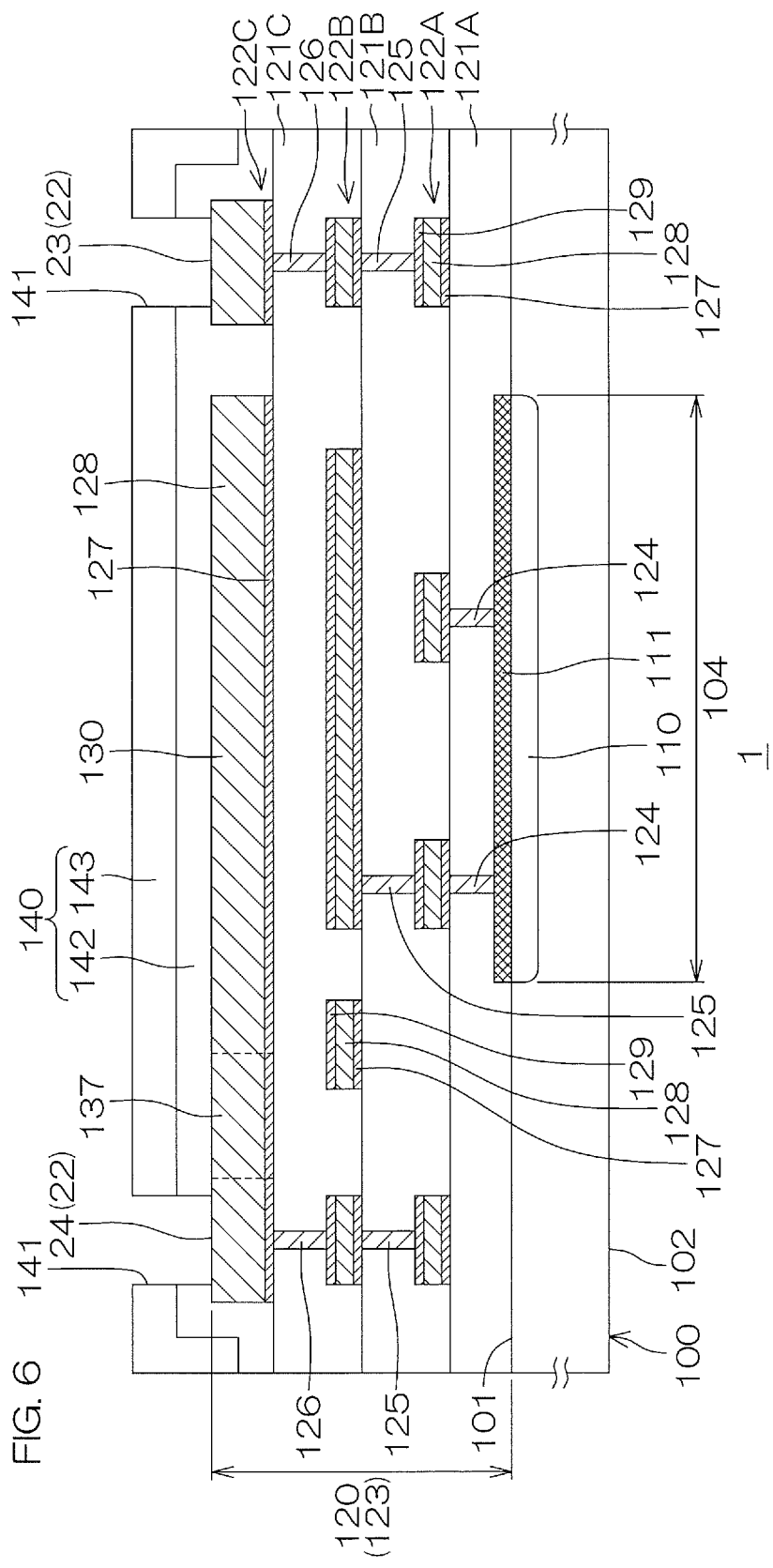
FIG. 6 is a schematic cross-sectional view of the semiconductor device shown in FIG. 4.
Figure 7:
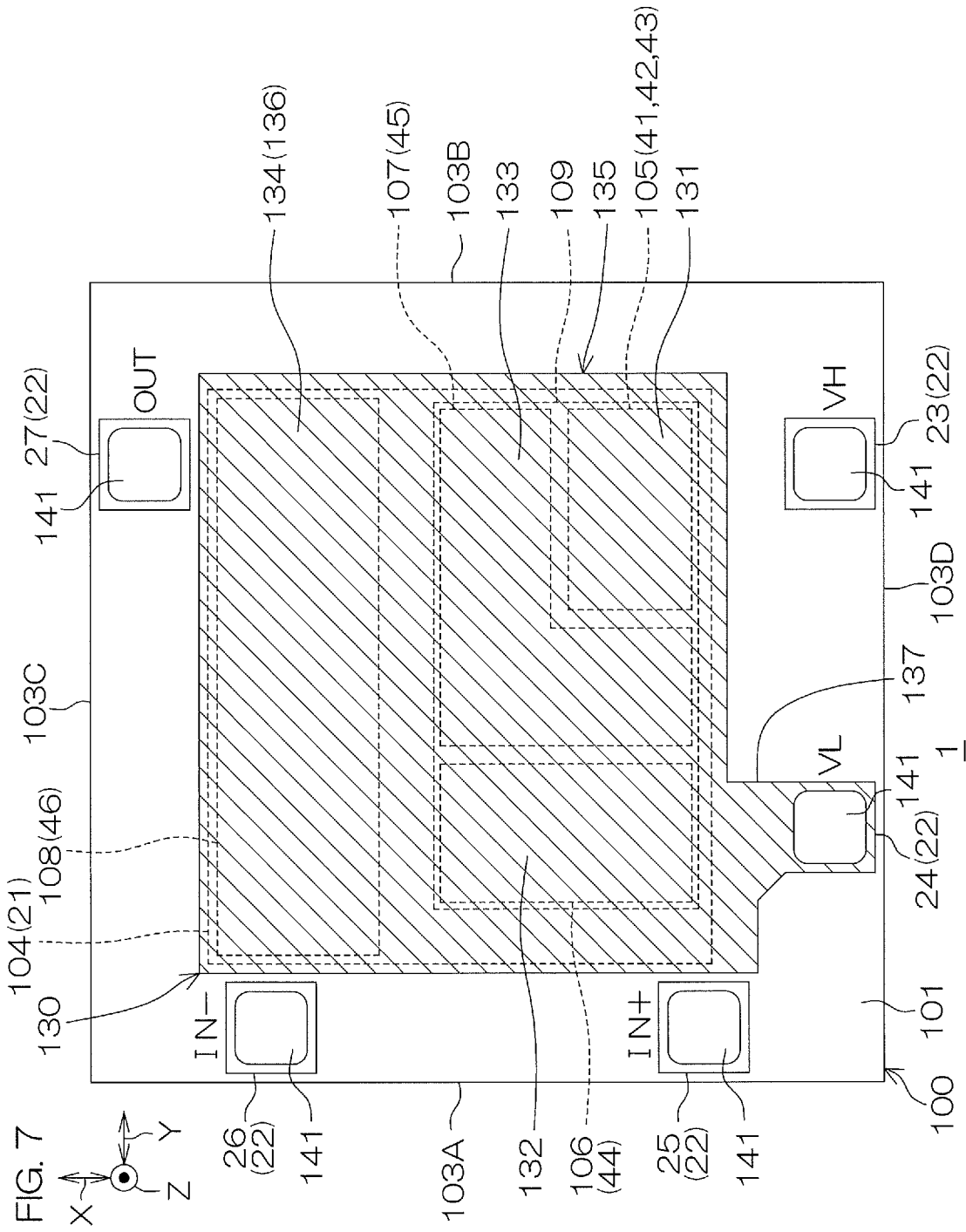
FIG. 7 is a plan view in which a shield electrode is added to the layout shown in FIG. 5.
Figure 8A:
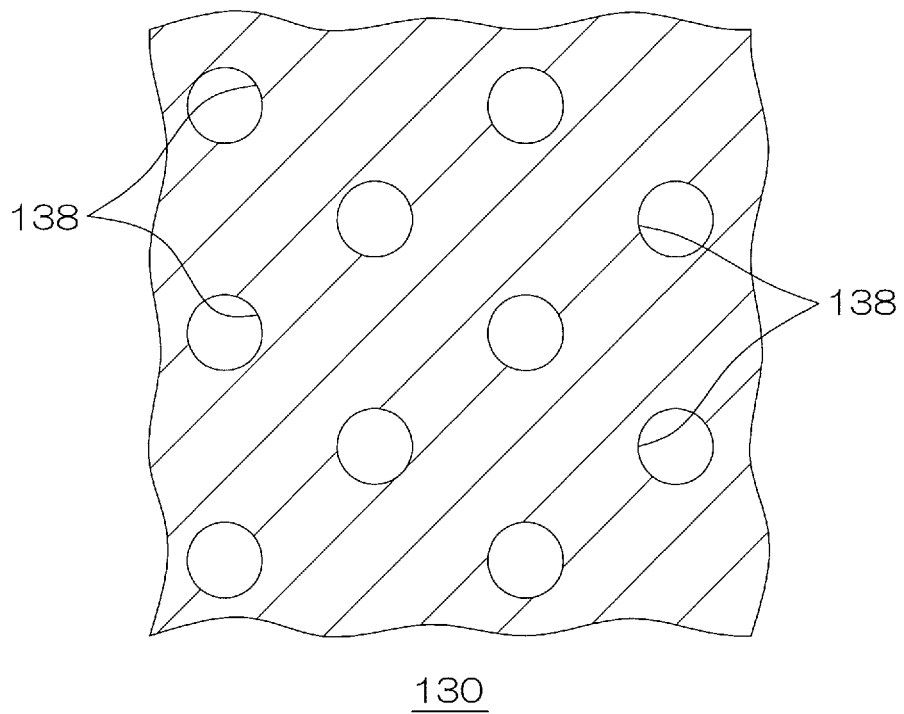
FIG. 8A is an enlarged plan view of a main portion of the shield electrode shown in FIG. 7.
Figure 8B:
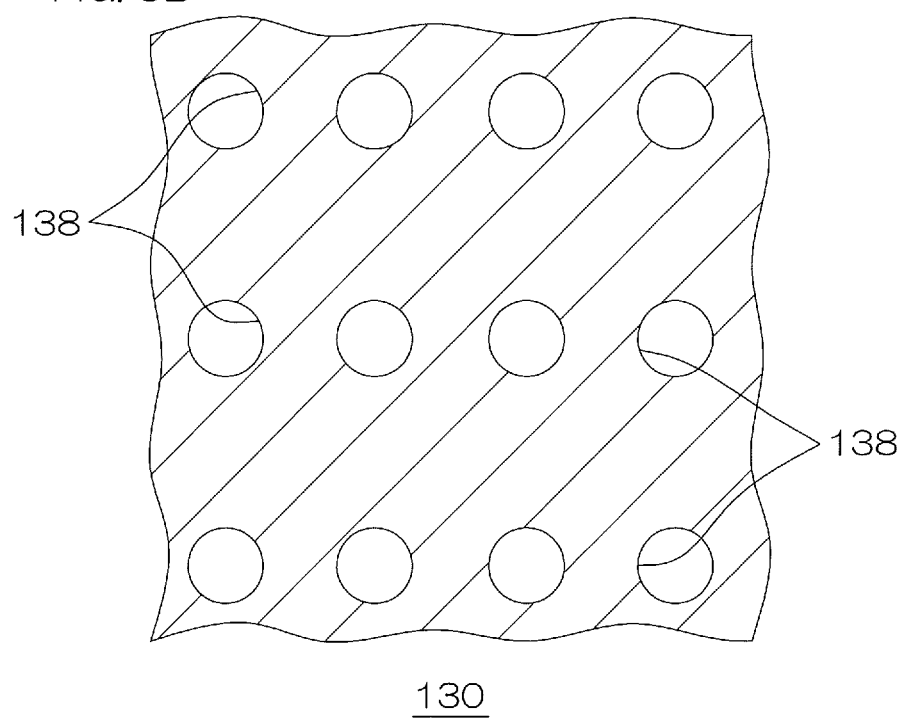
FIG. 8B is an enlarged plan view of the main portion of the shield electrode shown in FIG. 7.

FIG. 5 is a plan view in which the layout of an internal structure of the semiconductor device 1 of FIG. 3 is shown by a block diagram. FIG. 6 is a schematic cross-sectional view of the semiconductor device 1 shown in FIG. 4. FIG. 7 is a plan view in which a shield electrode 130 is added to the layout shown in FIG. 5. FIG. 8A and FIG. 8B are enlarged plan views of a main portion of the shield electrode 130 shown in FIG. 7. FIG. 6 shows a cross-sectional structure of the semiconductor device 1 in a simplified form, and does not show a cross section of a specific place.

Referring to FIG. 5 to FIG. 7, the semiconductor device 1 includes a silicon-made semiconductor chip 100 formed in a rectangular parallelepiped shape. The semiconductor chip 100 has a first main surface 101 on one side, a second main surface 102 on the other side, and first to fourth side surfaces 103A to 103D that connect the first main surface 101 and the second main surface 102 together. The first main surface 101 and the second main surface 102 are each formed in a quadrangular shape in a plan view seen from their normal directions Z (hereinafter, referred to simply as a "plan view").

The first to fourth side surfaces 103A to 103D include a first side surface 103A, a second side surface 103B, a third side surface 103C, and a fourth side surface 103D. The first side surface 103A and the second side surface 103B extend along a first direction X along the first main surface 101, and face a second direction Y that intersects (in detail, orthogonally intersects) the first direction X. The third side surface 103C and the fourth side surface 103D extend along the second direction Y, and face the first direction X.

The semiconductor device 1 includes a device region 104 demarcated at the first main surface 101 of the semiconductor chip 100. The device region 104 is demarcated at an inward portion of the first main surface 101 at a distance from the first to fourth side surfaces 103A to 103D. In detail, the device region 104 includes a constant current region 105, an input region 106, an amplification region 107, and an output region 108 that are demarcated at a distance from each other. The constant current region 105, the input region 106, and the amplification region 107 form a single differential amplification region 109.

The constant current region 105 is demarcated in a region in the vicinity of a corner portion that connects the second side surface 103B and the fourth side surface 103D together in the first main surface 101. The input region 106 is demarcated in a region in the vicinity of a corner portion that connects the first side surface 103A and the fourth side surface 103D together in the first main surface 101. The amplification region 107 is demarcated in a region between the constant current region 105 and the input region 106 in the first main surface 101. In this embodiment, the amplification region 107 is demarcated in the shape of the capital letter L facing the constant current region 105 from two directions on the first-side-surface-103A side and on the third-side-surface-103C side in a plan view.

The output region 108 is demarcated in a region on the third-side-surface-103C side in the first main surface 101, and faces the input region 106 and the amplification region 107. The output region 108 faces the constant current region 105 with a part of the amplification region 107 between the output region 108 and the constant current region 105. The constant current region 105, the input region 106, the amplification region 107, and the output region 108 are arbitrary in disposition and in planar shape, and are not limited to a specific place and to a specific shape.

The semiconductor device 1 includes the differential amplifier 21 formed in the device region 104. In detail, the differential amplifier 21 includes a plurality of constant current circuits 41 to 43 formed in the constant current region 105, an input circuit 44 formed in the input region 106, an amplifier circuit 45 formed in the amplification region 107, and an output circuit 46 formed in the output region 108. The differential amplifier 21 includes a plurality of transistors built into the first main surface 101. In FIG. 7, the structure of the differential amplifier 21 is shown in a simplified form by use of a semiconductor region 110 on the semiconductor-chip-100 side and an electrode structure 111 (see the hatching portion) on the upper side of the semiconductor chip 100.

The semiconductor device 1 includes an insulation layer 120 that is laminated on the first main surface 101 of the semiconductor chip 100 and that collectively covers the device region 104 (the constant current region 105, the input region 106, the amplification region 107, and the output region 108). The insulation layer 120 consists of a multilayer wiring structure 123 having a layered structure in which a plurality of interlayer insulation layers 121 and a plurality of wiring layers 122 are alternately laminated together. The interlayer insulation layer 121 denotes an insulation layer 120 interposed between two wiring layers 122 adjoining in the up-down direction. It should be noted that a lowermost interlayer insulation layer 121 of the interlayer insulation layers 121 denotes an insulation layer 120 interposed between the semiconductor chip 100 and the first wiring layer 122.

In this embodiment, the multilayer wiring structure 123 has a layered structure in which first to third interlayer insulation layers 121A to 121C and first to third wiring layers 122A to 123C are alternately laminated together. The number of layers of both the interlayer insulation layer 121 and the wiring layer 122 laminated together is arbitrary, and is not limited to a specific numerical value. Therefore, the multilayer wiring structure 123 may have a layered structure in which four or more interlayer insulation layers 121 and four or more wiring layers 122 are alternately laminated together.

Each of the interlayer insulation layers 121 includes at least either one of an $SiO_2$ film and a SiN film. Each of the interlayer insulation layers 121 may have a single-layer structure consisting of an $SiO_2$ film or an SiN film. Each of the interlayer insulation layers 121 may have a layered structure in which a plurality of $SiO_2$ films or a plurality of SiN films are laminated together. Each of the interlayer insulation layers 121 may have a layered structure in which a single or a plurality of $SiO_2$ films and a single or a plurality of SiN films are laminated together in arbitrary order.

Each of the interlayer insulation layers 121 may have a thickness of not less than 1 μm and not more than 5 μm. The interlayer insulation layers 121 are not necessarily required to have a thickness equal to each other, and may have a thickness differing from each other.

A plurality of first wiring layers 122A are formed on a first interlayer insulation layer 121A that is a lowermost one. Each of the first wiring layers 122A forms a part of a wiring portion of the circuit diagram shown in FIG. 4. The first wiring layers 122A are selectively drawn around onto the first interlayer insulation layer 121A. Each of the first wiring layers 122A is electrically connected to a corresponding circuit among the constant current circuits 41 to 43, the input circuit 44, the amplifier circuit 45, and the output circuit 46 through an arbitrary first via electrode 124 or a plurality of first via electrodes 124 that pass through the first interlayer insulation layer 121A. The first via electrode 124 may be a tungsten plug electrode. The first wiring layer 122A may have a thickness of not less than 0.1 μm and not more than 1 μm.

A plurality of second wiring layers 122B are formed on a second interlayer insulation layer 121B that is an intermediate one. Each of the second wiring layers 122B forms a part of the wiring portion of the circuit diagram shown in FIG. 4. The second wiring layers 122B are selectively drawn around onto the second interlayer insulation layer 121B. Each of the second wiring layers 122B is electrically connected to a corresponding one of the first wiring layers 122A through an arbitrary second via electrode 125 or a plurality of second via electrodes 125 that pass through the second interlayer insulation layer 121B. The second via electrode 125 may be a tungsten plug electrode. The second wiring layer 122B may have a thickness of not less than 0.1 μm and not more than 1 μm.

A plurality of third wiring layers 122C are formed on a third interlayer insulation layer 121A that is an uppermost one. Each of the third wiring layers 122C forms a part of the wiring portion of the circuit diagram shown in FIG. 4. The third wiring layers 122C are selectively drawn around onto the third interlayer insulation layer 121C. Each of the third wiring layers 122C is electrically connected to a corresponding one of the second wiring layers 122B through an arbitrary third via electrode 126 or a plurality of third via electrodes 126 that pass through the third interlayer insulation layer 121C. The third via electrode 126 may be a tungsten plug electrode. The third wiring layer 122C is formed thicker than the first and second wiring layers 122A and 122B that are arranged on the lower-layer side.

Each of the first and second wiring layers 122A and 122 includes a first barrier film 127, a main wiring film 128, and a second barrier film 129 that are laminated together in this order from the semiconductor-chip-100 side. On the other hand, the uppermost third wiring layer 122C differs in the electrode structure from the first and second wiring layers 122A and 122B arranged on the lower-layer side. In this embodiment, the uppermost third wiring layer 122C includes the first barrier film 127 and the main wiring film 128 laminated together in this order from the semiconductor-chip-100 side, and does not have the second barrier film 129.

The first and second barrier films 127 and 129 are each made of a Ti-based metal film. Each of the first and second barrier films 127 and 129 may have a layered structure including a Ti film and a TiN film laminated together in arbitrary order. Each of the first and second barrier films 127 and 129 may have a single-layer structure made of a Ti film or a TiN film. The thickness of each of the first and second barrier films 127 and 129 may be not less than 0.1 μm and not more than 0.5 μm.

The main wiring film 128 is made of an Al-based metal film. The main wiring film 128 may include at least one among an Al film, an AlSiCu alloy film, an AlSi alloy film, and an AlCu alloy film. The main wiring film 128 has a thickness exceeding the thickness of the first barrier film 127 and the thickness of the second barrier film 129. The thickness of the main wiring film 128 may be not less than 1 μm and not more than 5 μm.

Referring to FIG. 5 and FIG. 7, the high-potential terminal 23, the low-potential terminal 24, the non-inverting input terminal 25, the inverting input terminal 26, and the output terminal 27 are each formed at a distance from each other on the uppermost third interlayer insulation layer 121C such as to serve as one of the uppermost third wiring layers 122C. The high-potential terminal 23, the low-potential terminal 24, the non-inverting input terminal 25, the inverting input terminal 26, and the output terminal 27 are each formed in a quadrangular shape in a plan view.

The high-potential terminal 23 is arranged such as to adjoin the constant current region 105 in a plan view. In detail, the high-potential terminal 23 is arranged in a region between the fourth side surface 103D and the constant current region 105 in a plan view. The low-potential terminal 24 is arranged such as to adjoin the input region 106 in a plan view. In detail, the low-potential terminal 24 is arranged in a region between the fourth side surface 103D and the input region 106 in a plan view. The low-potential terminal 24 faces the high-potential terminal 23 in the second direction Y.

The non-inverting input terminal 25 is arranged such as to adjoin the input region 106 in a plan view. In detail, the non-inverting input terminal 25 is arranged in a region between the first side surface 103A and the input region 106 in a plan view. The inverting input terminal 26 is arranged such as to adjoin the output region 108 in a plan view. In detail, the inverting input terminal 26 is arranged in a region between the first side surface 103A and the output region 108 in a plan view. The inverting input terminal 26 faces the non-inverting input terminal 25 in the first direction X.

The output terminal 27 is arranged such as to adjoin the output region 108 in a plan view. In detail, the output terminal 27 is arranged in a region between the third side surface 103C and the output region 108 in a plan view. Only the output terminal 27 is arranged in the region between the third side surface 103C and the output region 108. The output terminal 27 faces the high-potential terminal 23 in the first direction X with the constant current region 105, the amplification region 107, and the output region 108 that are interposed between the output terminal 27 and the high-potential terminal 23 in a plan view.

Referring to FIG. 7, the semiconductor device 1 includes a shield electrode 130 that is arranged on the first main surface 101 such as to conceal the device region 104 and that is fixed to the ground potential. In detail, the shield electrode 130 is incorporated in the insulation layer 120 (the multi-layer wiring structure 123). The shield electrode 130 intercepts electromagnetic waves from the outside. An electromagnetic interference signal, such as an RF (radio frequency) signal outside the operating frequency band of the differential amplifier 21, can be mentioned as an example of the electromagnetic waves from the outside.

Preferably, the shield electrode 130 has a shield frequency band within the range of not less than 1 MHz and not more than 5 GHz. This shield electrode 130 is enabled to appropriately intercept an electromagnetic interference signal of not less than 1 MHz and not more than 5 GHz. Particularly preferably, the shield electrode 130 has a shield frequency band within the range of, at least, not less than 1 MHz and not more than 2 GHz.

The shield electrode 130 forms one arbitrary wiring layer 122 among the first to third wiring layers 122A to 123C in the multilayer wiring structure 123, and is arranged on an arbitrary interlayer insulation layer 121. In this embodiment, the shield electrode 130 forms one uppermost third wiring layer 122C in the multilayer wiring structure 123, and is arranged on the uppermost third interlayer insulation layer 121C.

In this embodiment, the shield electrode 130 conceals the constant current region 105, the input region 106, the amplification region 107, and the output region 108. In detail, the shield electrode 130 integrally includes a first shield electrode 131 that conceals the constant current region 105, a second shield electrode 132 that conceals the input region 106, a third shield electrode 133 that conceals the amplification region 107, and a fourth shield electrode 134 that conceals the output region 108.

The first shield electrode 131 intercepts electromagnetic waves toward the constant current region 105 from the outside, and restrains a noise and a malfunction in the constant current region 105. Preferably, the first shield electrode 131 conceals the whole area of the constant current region 105. The second shield electrode 132 intercepts electromagnetic waves toward the input region 106 from the outside, and restrains a noise and a malfunction in the input region 106. Preferably, the second shield electrode 132 conceals the whole area of the input region 106.

The third shield electrode 133 intercepts electromagnetic waves toward the amplification region 107 from the outside, and restrains a noise and a malfunction in the amplification region 107. Preferably, the third shield electrode 133 conceals the whole area of the amplification region 107. The fourth shield electrode 134 intercepts electromagnetic waves toward the output region 108 from the outside, and restrains a noise and a malfunction in the output region 108. Preferably, the fourth shield electrode 134 conceals the whole area of the output region 108.

In this embodiment, the first shield electrode 131, the second shield electrode 132, and the third shield electrode 133 form a differential amplification shield electrode 135 that collectively conceals the differential amplification region 109 including the constant current region 105, the input region 106, and the amplification region 107. On the other hand, the fourth shield electrode 134 forms an output shield electrode 136 that singly conceals the output region 108.

The shield electrode 130 includes a shield connection portion 137 that extends toward the low-potential terminal 24 and that is electrically connected to the low-potential terminal 24. The shield connection portion 137 is merely required to be electrically connected to the low-potential terminal 24, and is drawn around in an arbitrary manner. In this embodiment, the shield electrode 130 is formed integrally with the low-potential terminal 24, and is fixed to the ground potential. In other words, the shield electrode 130 forms a single uppermost third wiring layer 122C with the low-potential terminal 24.

The shield electrode 130 is merely required to include at least one among the first to fourth shield electrodes 131 to 134, and is not necessarily required to simultaneously include all of the first to fourth shield electrodes 131 to 134. Preferably, the shield electrode 130 has either one of the first shield electrode 131 that conceals at least the constant current region 105 and the second shield electrode 132 that conceals the input region 106 among the first to fourth shield electrodes 131 to 134.

Particularly preferably, in this case, the shield electrode 130 has both the first shield electrode 131 and the second shield electrode 132. Most preferably, the shield electrode 130 includes all of the first to fourth shield electrodes 131 to 134. Also, the first to fourth shield electrodes 131 to 134 are merely required to be fixed to the ground potential, and are not necessarily required to be formed integrally. At least one among the first to fourth shield electrodes 131 to 134 may be formed as a structurally independent shield electrode.

Referring to FIG. 8A and FIG. 8B, the shield electrode 130 includes a plurality of through-holes 138. The through-holes 138 relax stress generated in the shield electrode 130. The through-holes 138 pass through the shield electrode 130, and expose the lower interlayer insulation layer 121. The through-holes 138 may be arranged in a staggered pattern as shown in FIG. 8A, and may be arranged in a matrix pattern as shown in FIG. 8B. Of course, the through-holes 138 may be arranged in a concentric circle pattern, and may be arranged in an irregular pattern.

In this embodiment, the through-holes 138 are each formed in a circular shape in a plan view. The planar shape of each of the through-holes 138 is arbitrary, and is not limited to the circular shape. The through-holes 138 may be each formed in a polygonal shape (for example, quadrangular shape), an elliptical shape, or the like in a plan view. Preferably, each of the through-holes 138 has a size smaller than the wavelength of a to-be-intercepted electromagnetic wave. In this case, it is possible to prevent electromagnetic waves from invading through the through-holes 138 while relaxing stress generated in the shield electrode 130.

The size of each of the through-holes 138 may be not less than 1 μm and not more than 10 μm. The size of each of the through-holes 138 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. Preferably, the size of each of the through-holes 138 is not less than 2 μm and not more than 6 μm. Each of the through-holes 138 is not necessarily required to have a mutually equal size, and may have a mutually different size.

If the through-hole 138 is circular, the size of the through-hole 138 is demarcated by the size of its diameter (the size of its long diameter if it is elliptical). If the through-hole 138 is a polygonal, the size of the through-hole 138 is demarcated by the length of its longest side or by the length of its longest diagonal. Preferably, the size of the through-holes 138 is less than the thickness of the shield electrode 130. The size of the through-holes 138 may be more than the thickness of the shield electrode 130.

Referring again to FIG. 6, the semiconductor device 1 includes a protective layer 140 that covers the insulation layer 120 (the multilayer wiring structure 123). The protective layer 140 covers the whole area of the shield electrode 130, and has a plurality of pad openings 141 in a region outside the shield electrode 130. The protective layer 140 enters the inside of the through-holes 138 from above the shield electrode 130. The protective layer 140 is contiguous to the insulation layer 120 (the uppermost third interlayer insulation layer 121C) in the through-holes 138. The pad openings 141 expose a part of the high-potential terminal 23, a part of the low-potential terminal 24, a part of the non-inverting input terminal 25, a part of the inverting input terminal 26, and a part of the output terminal 27 each of which serves as a pad portion.

The protective layer 140 has a layered structure including an inorganic insulation film 142 and an organic insulation film 143 that are laminated together in this order from the insulation-layer-120 side. In this embodiment, the inorganic insulation film 142 includes silicon nitride. The inorganic insulation film 142 may be referred to as a passivation film. Preferably, the inorganic insulation film 142 fills the through-holes 138 and covers the shield electrode 130. In other words, preferably, the inorganic insulation film 142 is contiguous to the insulation layer 120 (the uppermost third interlayer insulation layer 121C) in the through-holes 138.

The organic insulation film 143 includes a negative type or positive type photosensitive resin. The organic insulation film 143 may include at least one among polyimide, polyamide, and polybenzoxazole. In this embodiment, the organic insulation film 143 includes polyimide. Preferably, the organic insulation film 143 is formed outside the through-holes 138, and covers the shield electrode 130 with the inorganic insulation film 142 between the organic insulation film 143 and the shield electrode 130.

As described above, the semiconductor device 1 includes the semiconductor chip 100, the differential amplifier 21, the insulation layer 120, and the shield electrode 130. The differential amplifier 21 is formed in the device region 104 demarcated at the first main surface 101, and amplifies and outputs a differential signal input thereto. The insulation layer 120 covers the device region 104 on the first main surface 101. The shield electrode 130 is arranged on the first main surface 101 such as to conceal the device region 104, and is fixed to the ground potential. In detail, the shield electrode 130 is incorporated in the insulation layer 120. This makes it possible to intercept electromagnetic waves from the outside by means of the shield electrode 130, thus making it possible to improve EMI (electromagnetic interference) immunity.

Preferably, the shield electrode 130 conceals either one of the constant current region 105 and the input region 106. In other words, preferably, the shield electrode 130 has either one of the first shield electrode 131 concealing the constant current region 105 and the second shield electrode 132 concealing the input region 106. This structure makes it possible to restrain a noise caused by electromagnetic waves in the stage of transforming a differential signal into a differential current. Therefore, it is possible to appropriately generate a differential current in which the noise is restrained. More preferably, the shield electrode 130 has both the first shield electrode 131 and the second shield electrode 132. This structure makes it possible to appropriately restrain a noise caused by electromagnetic waves in the stage of transforming a differential signal into a differential current.

More preferably, the shield electrode 130 conceals the constant current region 105, the input region 106, the amplification region 107, and the output region 108. In other words, more preferably, the shield electrode 130 includes the first shield electrode 131 that conceals the constant current region 105, the second shield electrode 132 that conceals the input region 106, the third shield electrode 133 that conceals the amplification region 107, and the fourth shield electrode 134 that conceals the output region 108. This structure makes it possible to appropriately restrain a noise caused by electromagnetic waves in the constant current stage, the input stage, the amplifier stage, and the output stage.

Preferably, the shield electrode 130 forms a part of the uppermost third wiring layer 122C in the multilayer wiring structure 123, and is arranged on the uppermost third interlayer insulation layer 121C. This structure makes it possible to appropriately form the shield electrode 130 without being subject to the limitation of the design rule of the first and second wiring layers 122A and 122B arranged on the lower-layer side. Also, on the contrary, this structure makes it possible to appropriately form the first and second wiring layers 122A and 122B without being subject to the limitation of the design rule of the shield electrode 130.

Preferably, the shield electrode 130 includes the through-holes 138. This structure makes it possible to relax stress generated in the shield electrode 130 by means of the through-holes 138, thus making it possible to restrain the warpage of the insulation layer 120 caused by the stress. The restraint of the warpage of the insulation layer 120 is effective for restraining the crack of the insulation layer 120. Preferably, each of the through-holes 138 has a size smaller than the wavelength of a to-be-intercepted electromagnetic wave. This structure makes it possible to prevent electromagnetic waves having wavelengths larger than the size of the through-holes 138 from passing through these through-holes 138. Therefore, it is possible to prevent electromagnetic waves from invading through the through-holes 138 while relaxing stress generated in the shield electrode 130.

The semiconductor device 1 may be incorporated in the semiconductor package 2 (see FIG. 1 to FIG. 3). According to the semiconductor package 2, the die pad 7 and the shield electrode 130 are fixed to the ground potential. In other words, the differential amplifier 21 built into the semiconductor chip 100 is interposed and held between the die pad 7 and the shield electrode 130. This makes it possible to obtain an electromagnetic-wave intercepting effect by both the die pad 7 and the shield electrode 130. Therefore, it is possible to raise the EMI immunity of the semiconductor device 1 in a state of being mounted in the semiconductor package 2.

Figure 9:
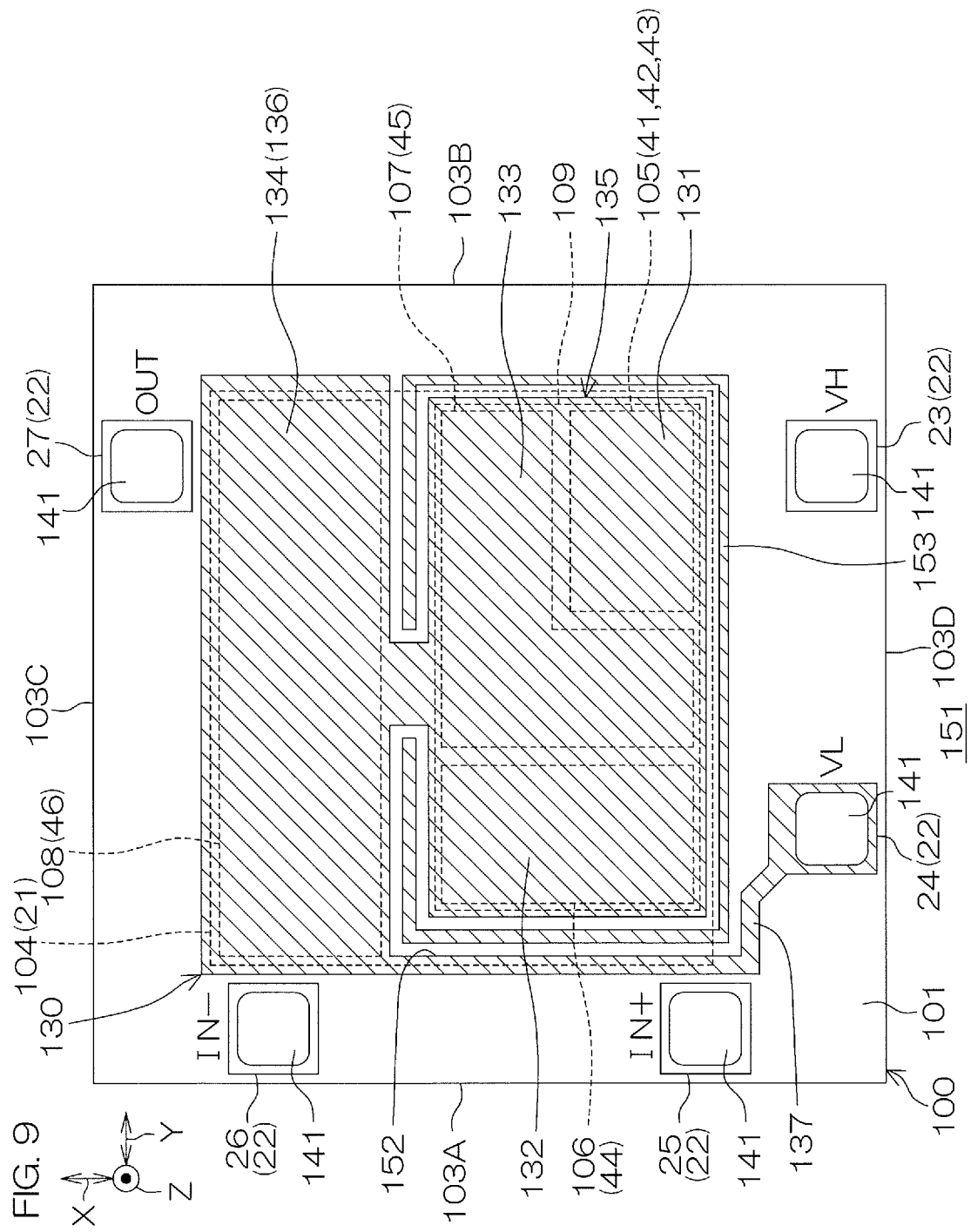
FIG. 9 is a plan view corresponding to FIG. 7, and is a plan view to describe a structure of a semiconductor device according to a second embodiment of the present invention.

FIG. 9 is a plan view corresponding to FIG. 7, and is a plan view to describe a structure of a semiconductor device 151 according to a second embodiment of the present invention. The same reference sign is hereinafter given to a constituent equivalent to each constituent described with respect to the semiconductor device 1, and a description of the constituent is omitted.

Referring to FIG. 9, the semiconductor device 151 includes a slit 152 that fringes the differential amplification shield electrode 135 in the shield electrode 130. The slit 152 defines the differential amplification region 109 including the constant current region 105, the input region 106, and the amplification region 107 from the outside in a plan view. The slit 152 extends in the shape of the capital letter C in a plan view such as to allow a connection portion between the differential amplification shield electrode 135 and the output shield electrode 136 to remain.

The semiconductor device 151 includes a guard electrode 153 that is formed along the perimeter of the differential amplification shield electrode 135 at a distance from the differential amplification shield electrode 135, and is fixed to the ground potential. The guard electrode 153 forms one uppermost third wiring layer 122C in the multilayer wiring structure 123, and is arranged on the uppermost third interlayer insulation layer 121C. The guard electrode 153 is formed in a belt shape extending along the differential amplification shield electrode 135 such as to divisionally form the differential amplification shield electrode 135 from the outside in a plan view. The guard electrode 153 extends in the shape of the capital letter C in a plan view.

The guard electrode 153 is formed independently of (separately from) the low-potential terminal 24 and the shield electrode 130 on the third interlayer insulation layer 121C. In this embodiment, the guard electrode 153 is electrically connected to the low-potential terminal 24 through the first and second wiring layers 122A and 122B that are arbitrary ones and through the first to third via electrodes 124 to 126 that are arbitrary ones. Of course, the guard electrode 153 may include a connection portion electrically connected to the low-potential terminal 24 on the third interlayer insulation layer 121C. In other words, the guard electrode 153 may be formed integrally with the low-potential terminal 24 and with the shield electrode 130.

As described above, the semiconductor device 151 is likewise enabled to fulfill the same effect as the effect described with respect to the semiconductor device 1. Also, the semiconductor device 151 includes the guard electrode 153 formed in a belt shape along the differential amplification shield electrode 135. Hence, when an ESD surge voltage is applied to any one of the high-potential terminal 23, the low-potential terminal 24, the non-inverting input terminal 25, the inverting input terminal 26, and the output terminal 27, it is possible to absorb this ESD surge voltage by means of the guard electrode 153. As a result, it is possible to improve electrostatic breakdown resistance.

Figure 10:
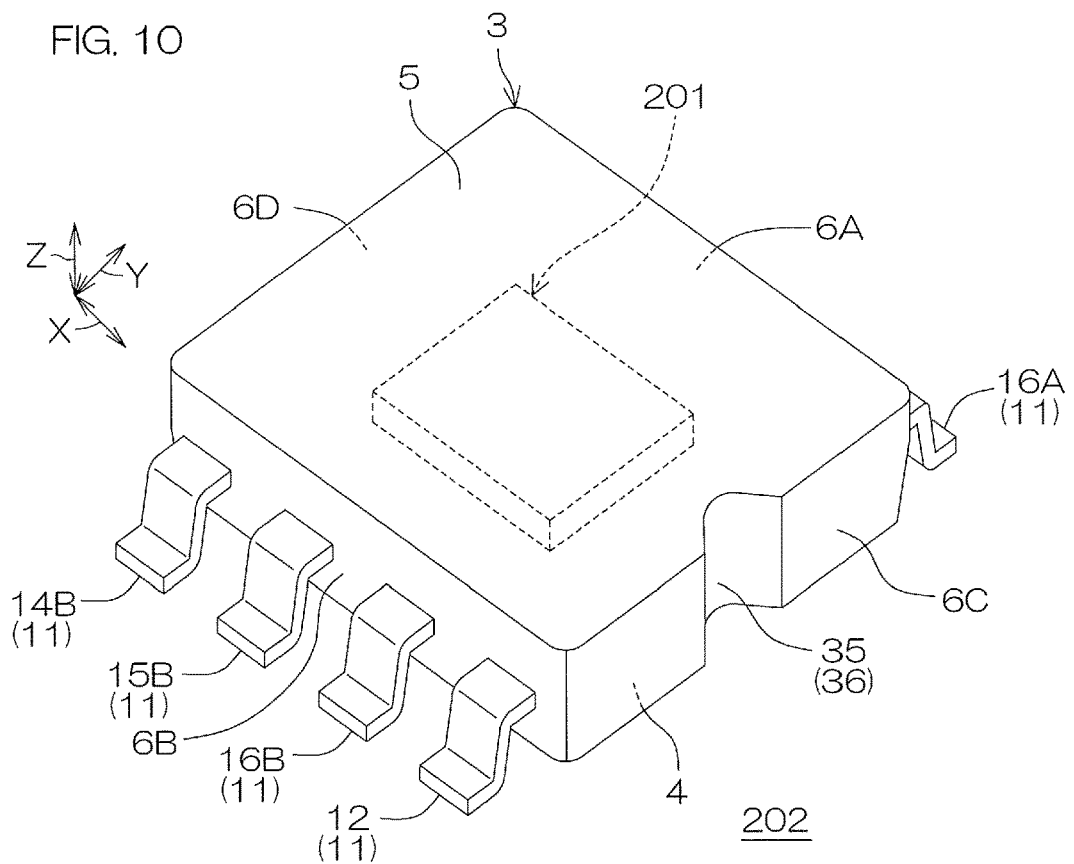
FIG. 10 is a perspective view showing a semiconductor package in which a semiconductor device according to a third embodiment of the present invention is incorporated.
Figure 11:
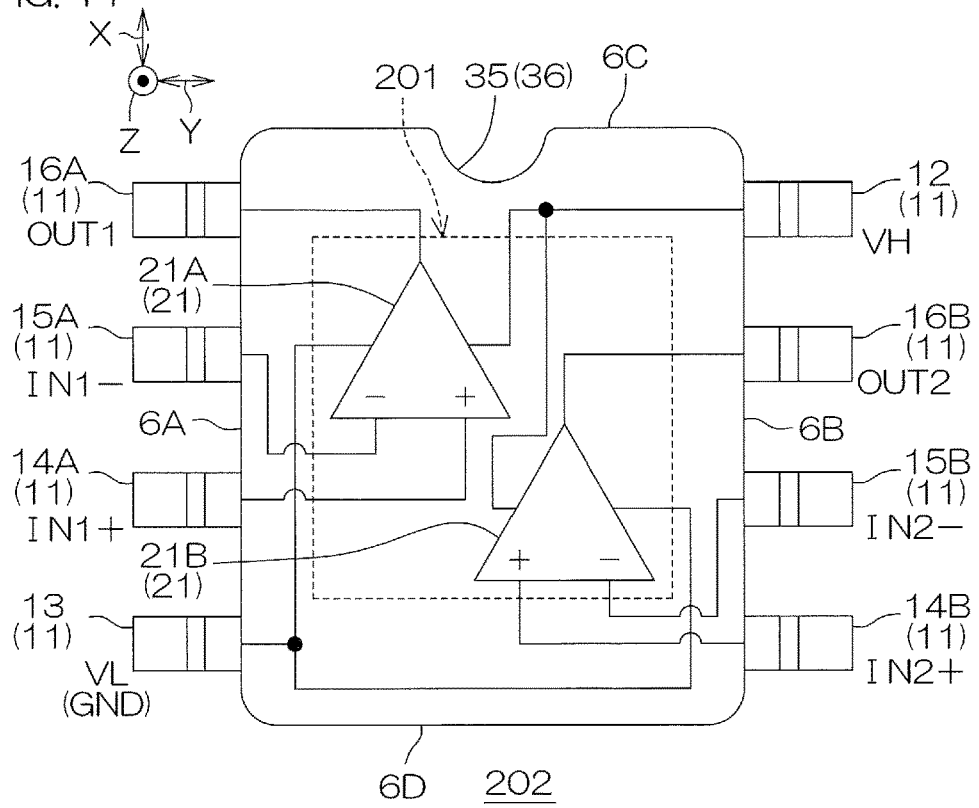
FIG. 11 is a view in which an electric structure of the semiconductor package shown in FIG. 10 is represented by circuit symbols.
Figure 12:
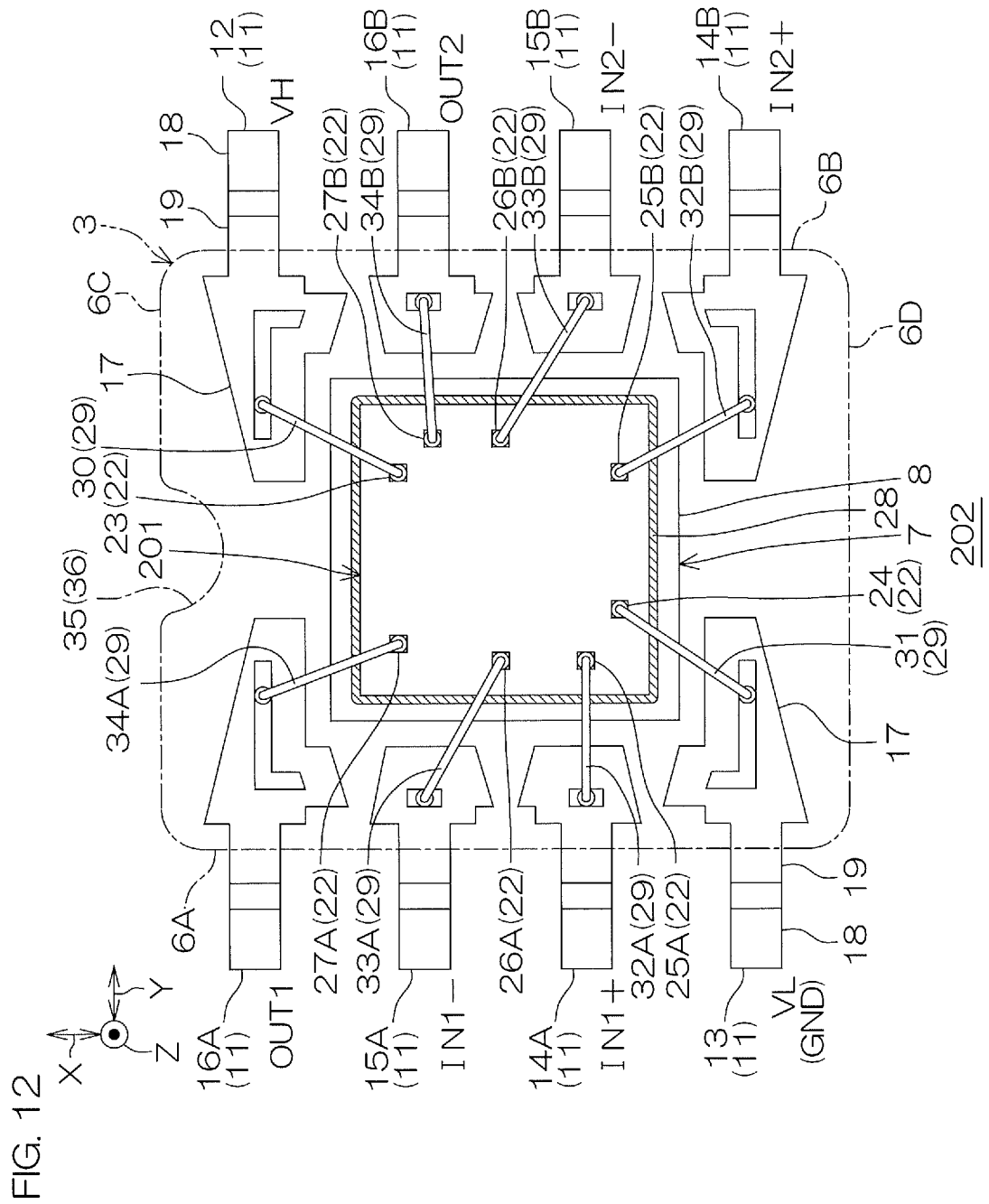
FIG. 12 is a plan view showing an internal structure of the semiconductor package shown in FIG. 10.

FIG. 10 is a perspective view showing a semiconductor package 202 in which a semiconductor device 201 according to a third embodiment of the present invention is incorporated. FIG. 11 is a view in which an electric structure of the semiconductor package 202 shown in FIG. 10 is represented by circuit symbols. FIG. 12 is a plan view showing an internal structure of the semiconductor package 202 shown in FIG. 10.

Referring to FIG. 10 to FIG. 12, the semiconductor package 202 consists of an eight-terminal type SOP in this embodiment. Without being limited to the SOP, the semiconductor package 202 may consist of a QFN, a DFP, a DIP, a QFP, an SIP, or an SOJ, or may consist of various packages similar to these packages.

The semiconductor package 202 includes the package body 3. The package body 3 is made of a molding resin (for example, epoxy resin), and is molded into a rectangular parallelepiped shape. The package body 3 has the mounting surface 4 on one side, the non-mounting surface 5 on the other side, and the first to fourth sidewalls 6A to 6D by which the mounting surface 4 and the non-mounting surface 5 are connected together. The mounting surface 4 and the non-mounting surface 5 are each formed in a quadrangular shape (in detail, a rectangular shape) in a plan view seen from their normal directions Z. The mounting surface 4 is a surface facing a to-be-connected object, to which the semiconductor package 202 is connected, in a state in which the semiconductor package 202 has been mounted on the to-be-connected object. A circuit board, such as PCB, can be mentioned as an example of the to-be-connected object.

The first to fourth sidewalls 6A to 6D include the first sidewall 6A, the second sidewall 6B, the third sidewall 6C, and the fourth sidewall 6D. The first sidewall 6A and the second sidewall 6B extend along the first direction X, and face the second direction Y perpendicular to the first direction X. The first sidewall 6A and the second sidewall 6B form long sides of the package body 3. The third sidewall 6C and the fourth sidewall 6D extend along the second direction Y, and face the first direction X. The third sidewall 6C and the fourth sidewall 6D form short sides of the package body 3. The length of the long side of the package body 3 may be not less than 4 mm and not more than 8 mm. The length of the short side of the package body 3 may be not less than 3 mm and not more than 7 mm.

The semiconductor package 202 includes the plate-shaped die pad 7 arranged in the package body 3. The die pad 7 is arranged on the mounting-surface-4 side in the package body 3. The die pad 7 includes at least one among copper, a copper-base alloy, iron, and an iron-base alloy. In this embodiment, the die pad 7 includes only the pad body 8, and does not have the first and second drawn portions 9 and 10. The die pad 7 (the pad body 8) is formed in a quadrangular shape in a plan view.

The semiconductor package 202 includes a plurality of (in this embodiment, eight) lead terminals 11 drawn outwardly from the inside of the package body 3. Each of the lead terminals 11 includes at least one among copper, a copper-base alloy, iron, and an iron-base alloy. In detail, the lead terminals 11 include the single high-potential lead terminal 12, the single low-potential lead terminal 13, the plurality of non-inverting input lead terminals 14, the plurality of inverting input lead terminals 15, and the plurality of output lead terminals 16.

The non-inverting input lead terminals 14 include the first non-inverting input lead terminal 14A and the second non-inverting input lead terminal 14B. The inverting input lead terminals 15 include the first inverting input lead terminal 15A and the second inverting input lead terminal 15B. The output lead terminals 16 include the first output lead terminal 16A and the second output lead terminal 16B. The high-potential lead terminal 12 and the low-potential lead terminal 13 are power lead terminals in which a reference potential is applied to the low-potential lead terminal 13. In detail, the low-potential lead terminal 13 is a ground lead terminal fixed to the ground potential.

The first output lead terminal 16A, the first inverting input lead terminal 15A, the first non-inverting input lead terminal 14A, and the low-potential lead terminal 13 are arranged on the first-sidewall-6A side with an interval between each other in this order from the third-sidewall-6C side toward the fourth-sidewall-6D side. The high-potential lead terminal 12, the second output lead terminal 16B, the second inverting input lead terminal 15B, and the second non-inverting input lead terminal 14B are arranged on the second-sidewall-6B side with an interval between each other in this order from the third-sidewall-6C side toward the fourth-sidewall-6D side.

The high-potential lead terminal 12 faces the first output lead terminal 16A with the package body 3 interposed between the high-potential lead terminal 12 and the first output lead terminal 16A. The second output lead terminal 16B faces the first inverting input lead terminal 15A with the package body 3 interposed between the second output lead terminal 16B and the first inverting input lead terminal 15A. The second inverting input lead terminal 15B faces the first non-inverting input lead terminal 14A with the package body 3 interposed between the second inverting input lead terminal 15B and the first non-inverting input lead terminal 14A. The second non-inverting input lead terminal 14B faces the low-potential lead terminal 13 with the package body 3 interposed between the second non-inverting input lead terminal 14B and the low-potential lead terminal 13.

Each of the lead terminals 11 has the inner end portion 17, the outer end portion 18, and the lead portion 19. The inner end portion 17 is placed inside the package body 3, and has a plate surface parallel to the mounting surface 4 (non-mounting surface 5). Each of the inner end portions 17 of the lead terminals 11 arranged at four corners is formed in the shape of the capital letter L such as to face two sides of the die pad 7 in a plan view. The outer end portion 18 is placed outside the package body 3, and has a plate surface parallel to the mounting surface 4 (non-mounting surface 5). The lead portion 19 is drawn outwardly from the inner end portion 17 and outwardly from the package body 3, and is connected to the outer end portion 18. The lead portion 19 is bent toward the mounting-surface-4 side outside the package body 3, and is connected to the outer end portion 18 at a height position at which the mounting surface 4 is crossed in the normal direction Z.

The lead terminals 11 are arbitrary in shape. Also, the high-potential lead terminal 12, the low-potential lead terminal 13, the first non-inverting input lead terminal 14A, the first inverting input lead terminal 15A, the first output lead terminal 16A, the second non-inverting input lead terminal 14B, the second inverting input lead terminal 15B, and the second output lead terminal 16B are arbitrary in disposition, and the disposition of these terminals is not limited to the disposition shown in FIG. 10 to FIG. 13.

The semiconductor package 202 includes the semiconductor device 201 arranged on the die pad 7 in the package body 3. The semiconductor device 201 is arranged on the non-mounting-surface-5 side with respect to the die pad 7 in the package body 3. The semiconductor device 201 includes the differential amplifier 21 that amplifies a differential signal input thereto and then outputs the resulting signal and the plurality of terminals 22 electrically connected to the differential amplifier 21 in the same way as the semiconductor device 1 according to the first embodiment. The differential amplifier 21 is formed inside the semiconductor device 201. The terminals 22 are formed on a surface on one side of the semiconductor device 201. The semiconductor device 201 is arranged on a plate surface on the non-mounting-surface-5 side of the die pad 7 in a posture in which the terminals 22 are allowed to face the non-mounting surface 5 of the package body 3.

The semiconductor device 201 differs from the semiconductor device 1 according to the first embodiment mentioned above in the fact that the semiconductor device 201 is a multichannel type including a plurality of (two or more) differential amplifiers 21. In this embodiment, the semiconductor device 201 is a dual channel type including two differential amplifiers 21 as an example of the multichannel type. The differential amplifiers 21 include a first differential amplifier 21A and a second differential amplifier 21B.

The terminals 22 include the single high-potential terminal 23, the single low-potential terminal 24, the plurality of non-inverting input terminals 25, the plurality of inverting input terminals 26, and the plurality of output terminals 27. The high-potential terminal 23 and the low-potential terminal 24 are power terminals in which a reference potential is applied to the low-potential terminal 24, and are each connected to the differential amplifiers 21 as a common terminal. In detail, the low-potential terminal 24 is a ground terminal fixed to the ground potential.

The non-inverting input terminals 25 include a first non-inverting input terminal 25A electrically connected to the first differential amplifier 21A and a second non-inverting input terminal 25B electrically connected to the second differential amplifier 21B. The inverting input terminals 26 include a first inverting input terminal 26A electrically connected to the first differential amplifier 21A and a second inverting input terminal 26B electrically connected to the second differential amplifier 21B. The output terminals 27 include a first output terminal 27A electrically connected to the first differential amplifier 21A and a second output terminal 27B electrically connected to the second differential amplifier 21B.

The semiconductor package 202 includes the conductive joining material 28 that is interposed between the die pad 7 and the semiconductor device 201 in the package body 3 and that joins the die pad 7 and the semiconductor device 201 together (see the hatching portion of FIG. 12). The conductive joining material 28 is an insulation adhesive, a metallic adhesive, or a solder.

The semiconductor package 202 includes a plurality of (in this embodiment, eight) lead wires 29 each of which electrically connects each of the terminals 22 of the semiconductor device 201 to a corresponding lead terminal 11 in the package body 3. Each of the lead wires 29 is a bonding wire. The lead wires 29 include at least one among copper wires, gold wires, and aluminum wires.

In detail, the lead wires 29 include the single high-potential lead wire 30, the single low-potential lead wire 31, the plurality of non-inverting input lead wires 32, the plurality of inverting input lead wires 33, and the plurality of output lead wires 34. The non-inverting input lead wires 32 include a first non-inverting input lead wire 32A and a second non-inverting input lead wire 32B. The inverting input lead wires 33 include a first inverting input lead wire 33A and a second inverting input lead wire 33B. The output lead wires 34 include a first output lead wire 34A and a second output lead wire 34B.

The high-potential lead wire 30 is connected to the high-potential lead terminal 12 and to the high-potential terminal 23. The low-potential lead wire 31 is connected to the low-potential lead terminal 13 and to the low-potential terminal 24. The first non-inverting input lead wire 32A is connected to the first non-inverting input lead terminal 14A and to the first non-inverting input terminal 25A. The second non-inverting input lead wire 32B is connected to the second non-inverting input lead terminal 14B and to the second non-inverting input terminal 25B.

The first inverting input lead wire 33A is connected to the first inverting input lead terminal 15A and to the first inverting input terminal 26A. The second inverting input lead wire 33B is connected to the second inverting input lead terminal 15B and to the second inverting input terminal 26B. The first output lead wire 34A is connected to the first output lead terminal 16A and to the first output terminal 27A. The second output lead wire 34B is connected to the second output lead terminal 16B and to the second output terminal 27B.

The semiconductor package 202 has a mark 35 representing the disposition of the lead terminals 11. In this embodiment, the mark 35 is a cavity 36 formed in the third sidewall 6C. The cavity 36 is hollowed in a circular-arc shape from the third sidewall 6C toward the fourth sidewall 6D in a plan view. Hence, the third sidewall 6C and the fourth sidewall 6D are formed asymmetrically, and the disposition of the lead terminals 11 is determined. Instead of the cavity 36 or in addition to this cavity 36, the mark 35 may be a mark colored with a color differing from that of the cavity formed in the non-mounting surface 5 and/or that of the semiconductor package 202. In this case, the mark 35 may be formed in the vicinity of an arbitrary lead terminal 11 (for example, the first output lead terminal 16A) in a plan view.

Figure 13:
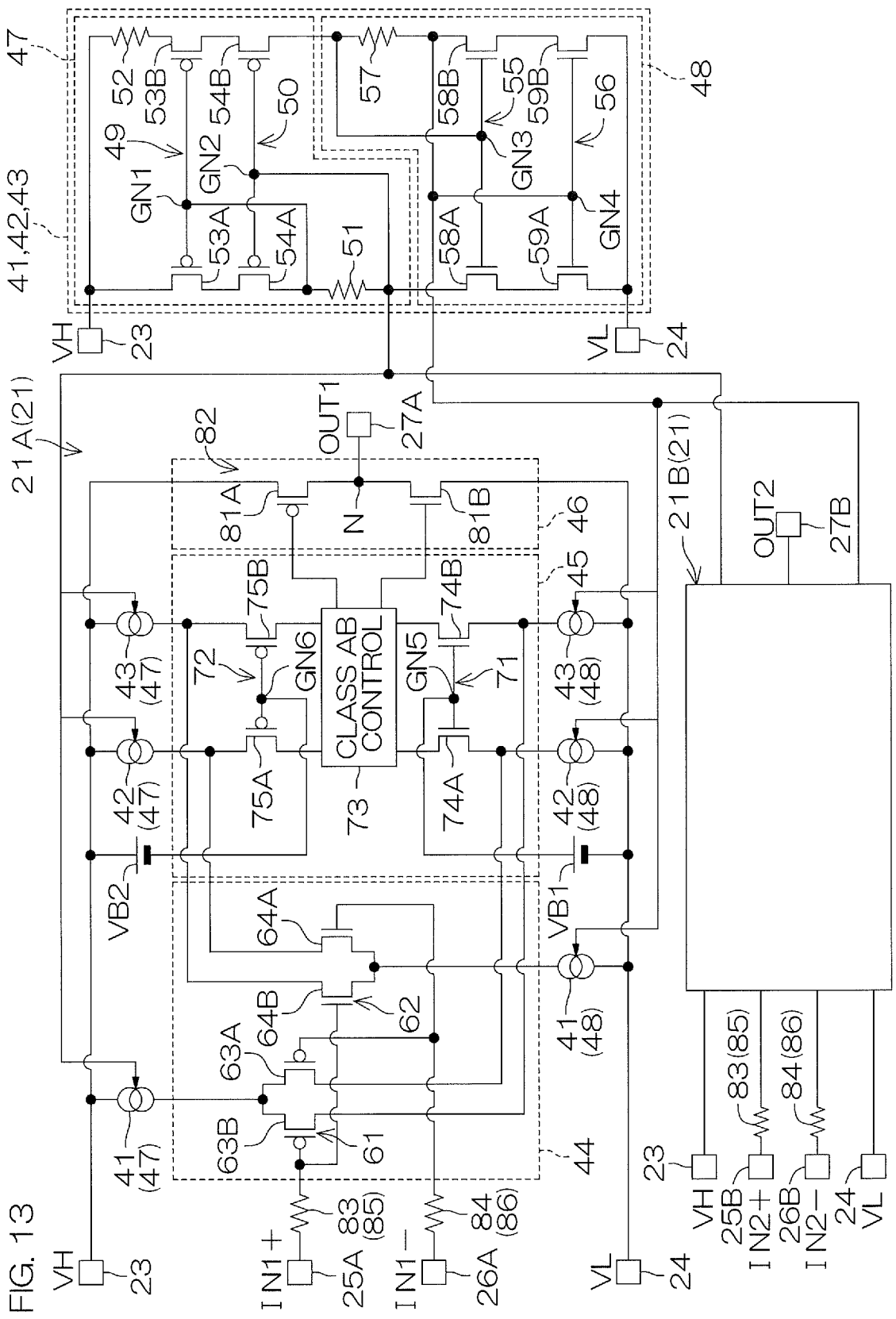
FIG. 13 is an electric circuit diagram showing an electric structure of the semiconductor device shown in FIG. 12.

FIG. 13 is an electric circuit diagram showing an electric structure of the semiconductor device 201 shown in FIG. 12. The semiconductor device 201 includes the first differential amplifier 21A and the second differential amplifier 21B. The first differential amplifier 21A is connected to the high-potential terminal 23, to the low-potential terminal 24, to the first non-inverting input terminal 25A, to the first inverting input terminal 26A, and to the first output terminal 27A, and amplifies and outputs a differential signal input thereto. The first differential amplifier 21A is a Rail-to-Rail output type class-AB amplifier in which a potential difference between the first non-inverting input terminal 25A and the first inverting input terminal 26A works within the range of a potential difference between the high-potential terminal 23 and the low-potential terminal 24.

The second differential amplifier 21B is connected to the high-potential terminal 23, to the low-potential terminal 24, to the second non-inverting input terminal 25B, to the second inverting input terminal 26B, and to the second output terminal 27B, and amplifies and outputs a differential signal input thereto. The second differential amplifier 21B is a Rail-to-Rail output type class-AB amplifier in which a potential difference between the second non-inverting input terminal 25B and the second inverting input terminal 26B works within the range of a potential difference between the high-potential terminal 23 and the low-potential terminal 24.

Each of the first and second differential amplifiers 21A and 21B includes the plurality of (in this embodiment, three) constant current circuits 41 to 43, the input circuit 44, the amplifier circuit 45, and the output circuit 46 in the same way as the differential amplifier 21 according to the first embodiment. The arrangement of the input circuit 44, the amplifier circuit 45, and the output circuit 46 of the second differential amplifier 21B is the same as the arrangement of the input circuit 44, the amplifier circuit 45, and the output circuit 46 of the first differential amplifier 21A, and therefore the second differential amplifier 21B is shown in a simplified form by a block diagram, and its circuit diagram is omitted without being concretely shown.

Also, the constant current circuits 41 to 43 of the first differential amplifier 21A and the constant current circuits 41 to 43 of the second differential amplifier 21B have the same arrangement, and therefore the constant current circuits 41 to 43 are shown by a single circuit diagram on the right-hand side in the plane of paper of FIG. 13. The arrangement of the constant current circuits 41 to 43, the input circuit 44, the amplifier circuit 45, and the output circuit 46 is the same as the arrangement of the circuits of the differential amplifier 21 according to the first embodiment, and therefore the same reference sign is given to each of these circuits, and a description of each circuit is omitted.

Figure 14:
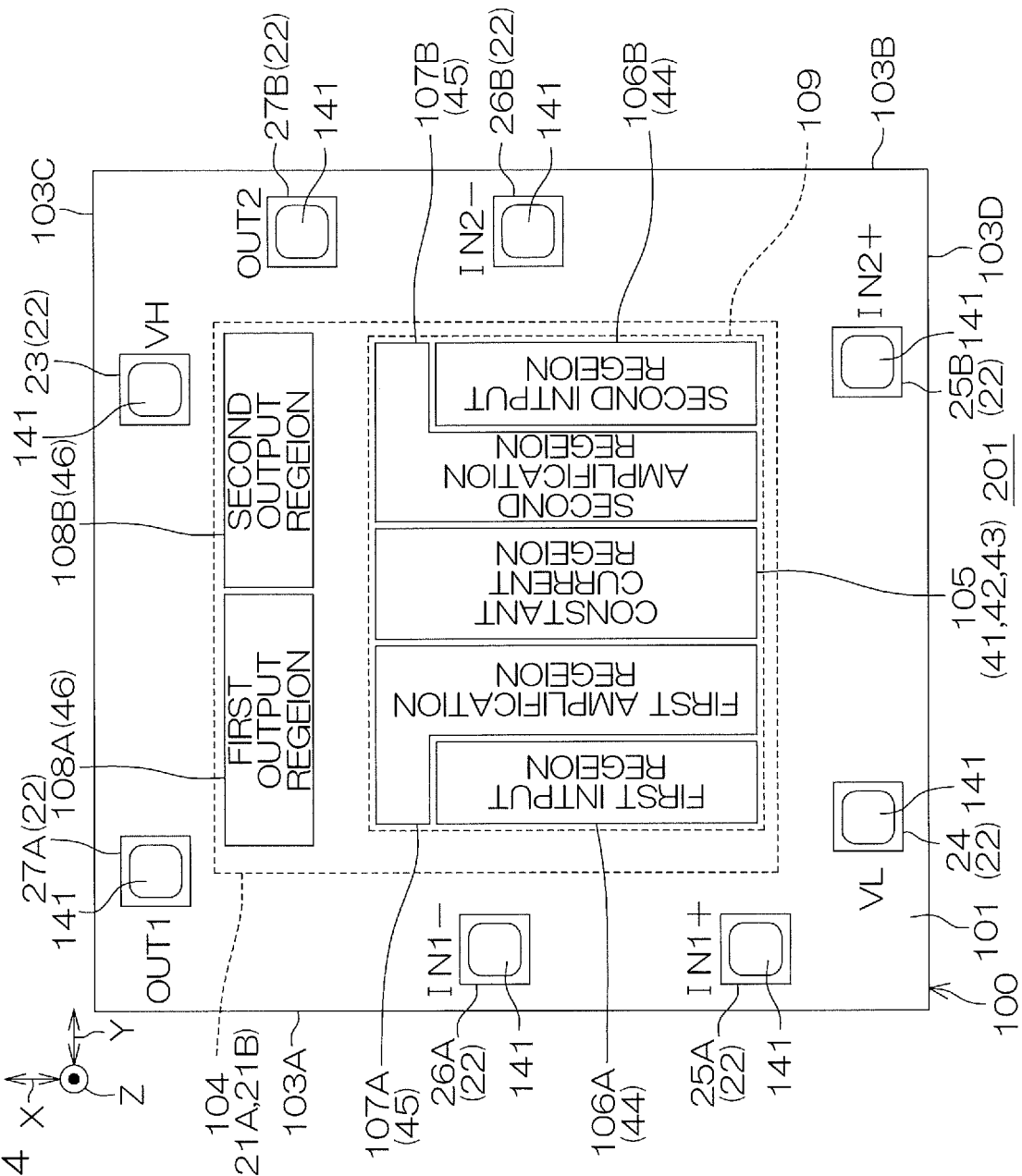
FIG. 14 is a plan view in which the layout of an internal structure of the semiconductor device shown in FIG. 12 is shown by a block diagram.
Figure 15:
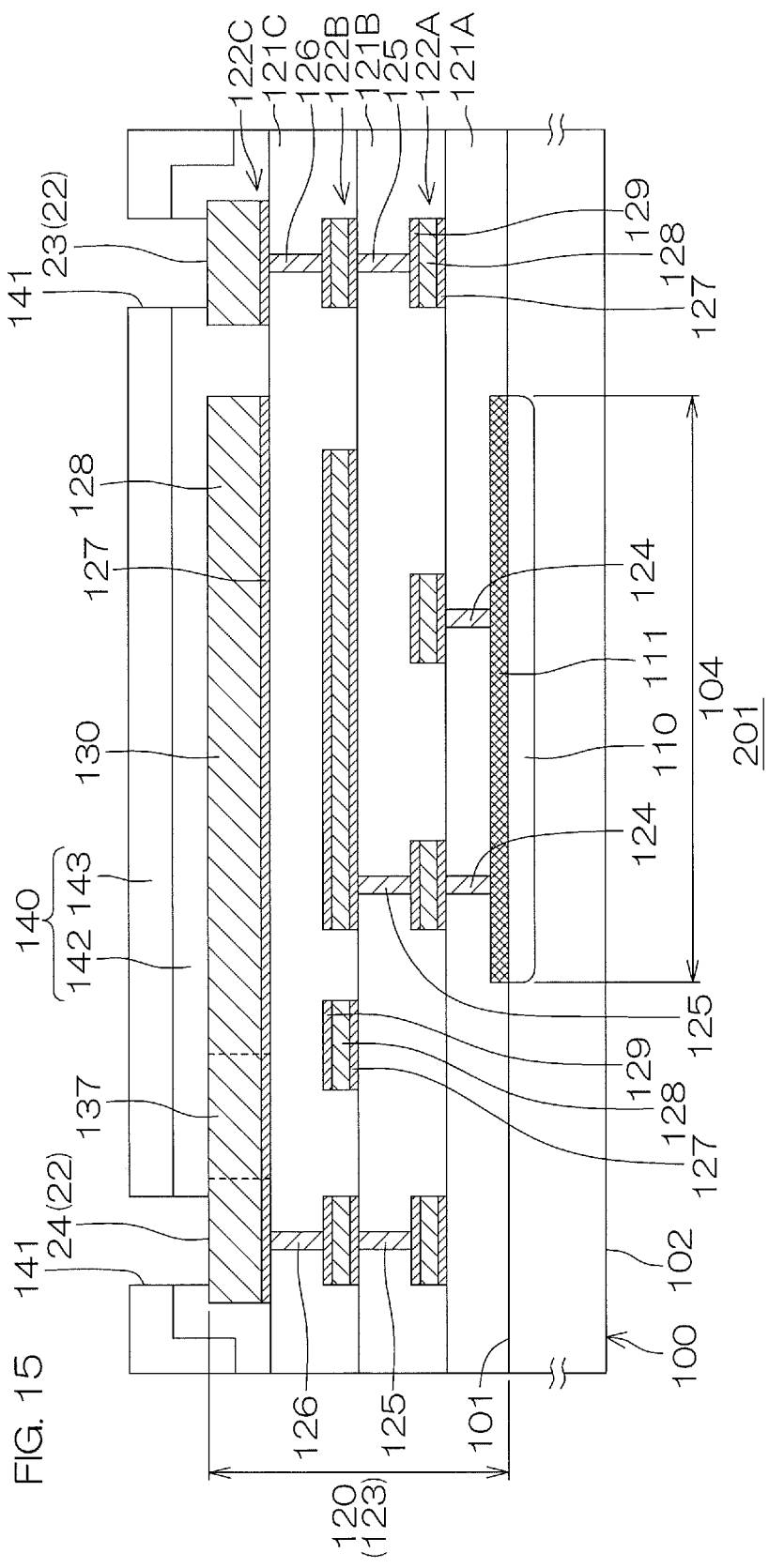
FIG. 15 is a schematic cross-sectional view of the semiconductor device shown in FIG. 14.
Figure 16:
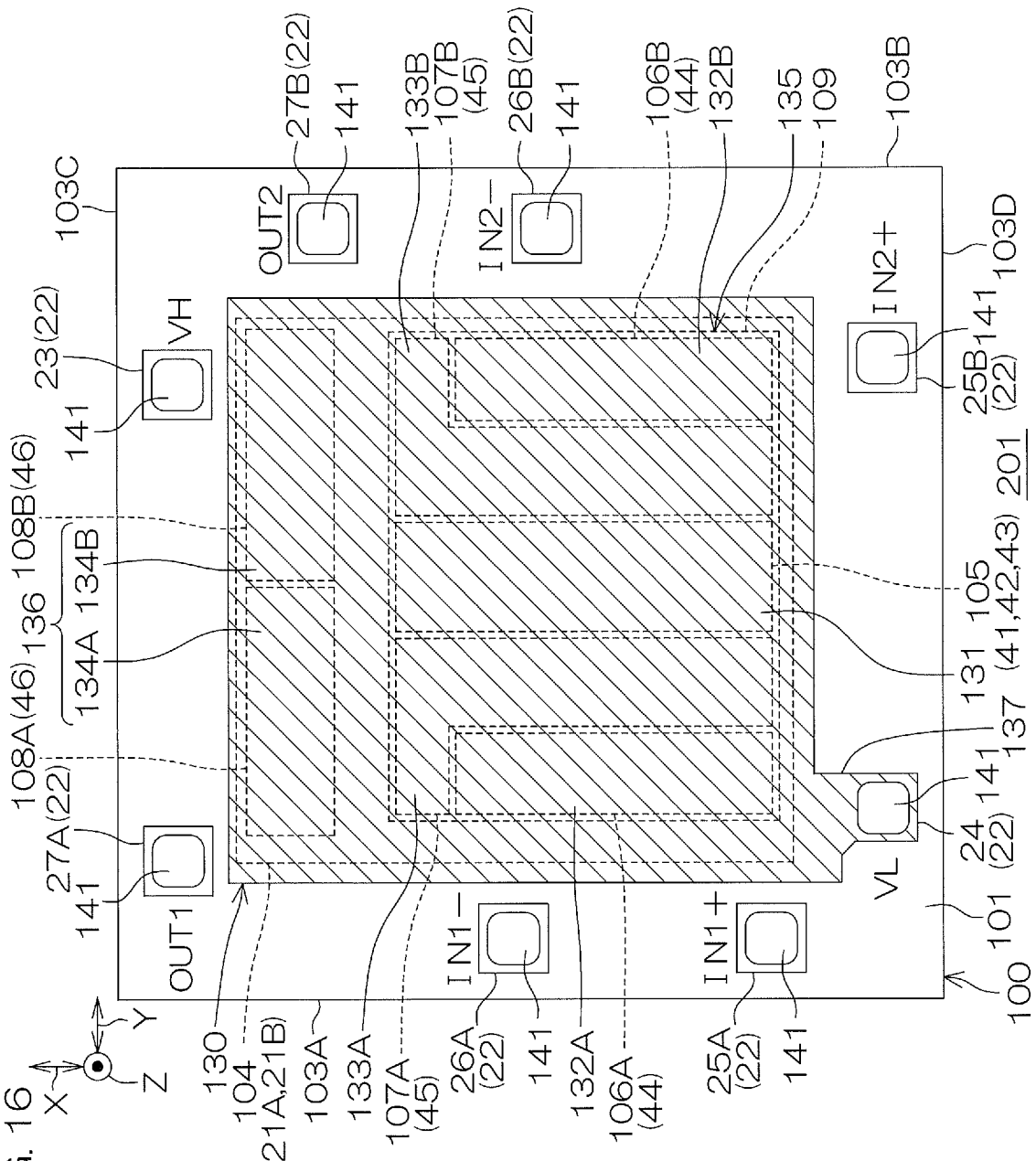
FIG. 16 is a plan view in which a shield electrode is added to the layout shown in FIG. 14.

FIG. 14 is a plan view in which the layout of an internal structure of the semiconductor device 201 shown in FIG. 12 is shown by a block diagram. FIG. 15 is a schematic cross-sectional view of the semiconductor device 201 shown in FIG. 14. FIG. 16 is a plan view in which the shield electrode 130 is added to the layout shown in FIG. 14. FIG. 15 shows a cross-sectional structure of the semiconductor device 201 in a simplified form, and does not show a cross section of a specific place.

Referring to FIG. 14 to FIG. 16, the semiconductor device 201 includes the semiconductor chip 100 and the device region 104 demarcated at the first main surface 101 of the semiconductor chip 100 in the same way as the semiconductor device 1 according to the first embodiment. In this embodiment, the device region 104 includes the constant current region 105, the input regions 106, the amplification regions 107, and the output regions 108 that are demarcated at a distance from each other.

The input regions 106 include a first input region 106A and a second input region 106B. The amplification regions 107 include a first amplification region 107A and a second amplification region 107B. The output regions 108 include a first output region 108A and a second output region 108B. The constant current region 105, the input regions 106, and the amplification regions 107 form the single differential amplification region 109.

The constant current region 105 is demarcated at a central portion of the first main surface 101. The constant current region 105 is demarcated in a quadrangular shape in a plan view. In this embodiment, the constant current region 105 is demarcated in a rectangular shape extending along the first direction X in a plan view.

The first input region 106A is demarcated in a region between the first side surface 103A and the constant current region 105 in the first main surface 101. The first input region 106A is demarcated in a region in the vicinity of a corner portion that connects the first side surface 103A and the fourth side surface 103D together. The first input region 106A is demarcated in a quadrangular shape in a plan view. In this embodiment, the first input region 106A is demarcated in a rectangular shape extending along the first direction X in a plan view.

The first amplification region 107A is demarcated in a region between the constant current region 105 and the first input region 106A in the first main surface 101. In this embodiment, the first amplification region 107A is demarcated in the shape of the capital letter L facing the first input region 106A from two directions on the second-side-surface-103B side and on the third-side-surface-103C side in a plan view.

The first output region 108A is demarcated in a region between the third side surface 103C and the first amplification region 107A in the first main surface 101. The first output region 108A is demarcated in a region in the vicinity of a corner portion that connects the first side surface 103A and the third side surface 103C together. The first output region 108A may face the constant current region 105 in the first direction X. The first output region 108A faces the first input region 106A with the first amplification region 107A between the first output region 108A and the first input region 106A.

The second input region 106B is demarcated in a region between the second side surface 103B and the constant current region 105. The second input region 106B is demarcated in a region in the vicinity of a corner portion that connects the second side surface 103B and the fourth side surface 103D together in the first main surface 101. The second input region 106B is demarcated in a quadrangular shape in a plan view. In this embodiment, the second input region 106B is demarcated in a rectangular shape extending along the first direction X in a plan view.

The second amplification region 107B is demarcated in a region between the constant current region 105 and the second input region 106B in the first main surface 101. In this embodiment, the second amplification region 107B is demarcated in the shape of the capital letter L facing the second input region 106B from two directions on the first-side-surface-103A side and on the third-side-surface-103C side in a plan view.

The second output region 108B is demarcated in a region between the third side surface 103C and the second amplification region 107B in the first main surface 101. The second output region 108B is demarcated in a region in the vicinity of a corner portion that connects the second side surface 103B and the third side surface 103C together, and faces the first output region 108A in the second direction Y. The second output region 108B may face the constant current region 105 in the first direction X. The second output region 108B faces the second input region 106B with the second amplification region 107B between the second output region 108B and the second input region 106B.

The constant current region 105, the first input region 106A, the second input region 106B, the first amplification region 107A, the second amplification region 107B, the first output region 108A, and the second output region 108B are arbitrary in disposition and in planar shape, and are not limited to a specific place and to a specific shape.

The semiconductor device 201 includes the differential amplifiers 21 formed in the device region 104. The differential amplifiers 21 include the first and second differential amplifiers 21A and 21B. The first differential amplifier 21A is built into a region on the first-side-surface-103A side, and the second differential amplifier 21B is built into a region on the second-side-surface-103B side with respect to the first differential amplifier 21A.

The first differential amplifier 21A includes the constant current circuits 41 to 43 formed in the constant current region 105, the input circuit 44 formed in the first input region 106A, the amplifier circuit 45 formed in the first amplification region 107A, and the output circuit 46 formed in the first output region 108A.

The second differential amplifier 21B includes the constant current circuits 41 to 43 formed in the constant current region 105, the input circuit 44 formed in the second input region 106B, the amplifier circuit 45 formed in the second amplification region 107B, and the output circuit 46 formed in the second output region 108B. The constant current circuits 41 to 43 of the second differential amplifier 21B are gathered in the single constant current region 105 together with the constant current circuits 41 to 43 of the first differential amplifier 21A.

The differential amplifiers 21 respectively include a plurality of transistors built into the first main surface 101. In FIG. 15, the structure of the differential amplifiers 21 is shown in a simplified form by use of the semiconductor region 110 on the semiconductor-chip-100 side and the electrode structure 111 on the upper side of the semiconductor chip 100 (see the hatching portion).

Referring to FIG. 15, the semiconductor device 201 includes the insulation layer 120 (the multilayer wiring structure 123) that is laminated on the first main surface 101 and that collectively covers the device region 104 (the constant current region 105, the input regions 106, the amplification regions 107, and the output regions 108) in the same way as the semiconductor device 1 according to the first embodiment. In this embodiment, each of the first to third wiring layers 122A to 122C forms a part of the wiring portion of the circuit diagram shown in FIG. 13.

Referring to FIG. 14 and FIG. 16, the high-potential terminal 23, the low-potential terminal 24, the first non-inverting input terminal 25A, the first inverting input terminal 26A, the first output terminal 27A, the second non-inverting input terminal 25B, the second inverting input terminal 26B, and the second output terminal 27B are each formed at a distance from each other on the uppermost third interlayer insulation layer 121C such as to serve as the uppermost third wiring layer 122C. The high-potential terminal 23, the low-potential terminal 24, the first non-inverting input terminal 25A, the first inverting input terminal 26A, the first output terminal 27A, the second non-inverting input terminal 25B, the second inverting input terminal 26B, and the second output terminal 27B are each formed in a quadrangular shape in a plan view.

The high-potential terminal 23 is arranged such as to adjoin the second output region 108B in a plan view. In detail, the high-potential terminal 23 is arranged in a region between the third side surface 103C and the second output region 108B in a plan view. The low-potential terminal 24 is arranged such as to adjoin the first input region 106A in a plan view. In detail, the low-potential terminal 24 is arranged in a region between the fourth side surface 103D and the first input region 106A in a plan view.

The first non-inverting input terminal 25A is arranged such as to adjoin the first input region 106A in a plan view. In detail, the first non-inverting input terminal 25A is arranged in a region between the first side surface 103A and the first input region 106A in a plan view.

The first inverting input terminal 26A is arranged such as to adjoin the first input region 106A in a plan view. In detail, the first inverting input terminal 26A is arranged in a region between the first side surface 103A and the first input region 106A in a plan view. The first inverting input terminal 26A is arranged at a distance from the first non-inverting input terminal 25A toward the third-side-surface-103C side, and faces the first non-inverting input terminal 25A in the first direction X.

The first output terminal 27A is arranged such as to adjoin the first output region 108A in a plan view. In detail, the first output terminal 27A is arranged in a region between the third side surface 103C and the first output region 108A in a plan view.

The second non-inverting input terminal 25B is arranged such as to adjoin the second input region 106B in a plan view. In detail, the second non-inverting input terminal 25B is arranged in a region between the fourth side surface 103D and the second input region 106B in a plan view. The second non-inverting input terminal 25B is arranged at a distance from the low-potential terminal 24 toward the second-side-surface-103B side, and faces the low-potential terminal 24 in the second direction Y.

The second inverting input terminal 26B is arranged such as to adjoin the second input region 106B in a plan view. In detail, the second inverting input terminal 26B is arranged in a region between the second side surface 103B and the second input region 106B in a plan view.

The second output terminal 27B is arranged such as to adjoin the second output region 108B in a plan view. In detail, the second output terminal 27B is arranged in a region between the second side surface 103B and the second output region 108B in a plan view. The second output terminal 27B may be arranged such as to adjoin the second amplification region 107B. In other words, a part or all of the second output terminal 27B may be arranged in a region between the second side surface 103B and the second amplification region 107B in a plan view. The second output terminal 27B is arranged at a distance from the second inverting input terminal 26B toward the third-side-surface-103C side, and faces the second inverting input terminal 26B in the first direction X.

Referring to FIG. 16, the semiconductor device 201 includes the shield electrode 130 that is arranged on the first main surface 101 such as to conceal the device region 104 and that is fixed to the ground potential in the same way as the semiconductor device 1 according to the first embodiment. In detail, the shield electrode 130 is incorporated in the insulation layer 120 (the multilayer wiring structure 123). The shield electrode 130 intercepts electromagnetic waves from the outside. An electromagnetic interference signal, such as an RF (radio frequency) signal outside the operating frequency band of the differential amplifier 21 (the first and second differential amplifiers 21A and 21B), can be mentioned as an example of the electromagnetic waves from the outside.

The shield electrode 130 has a shield frequency band within the range of not less than 1 MHz and not more than 5 GHz. This shield electrode 130 is enabled to appropriately intercept an electromagnetic interference signal of not less than 1 MHz and not more than 5 GHz. Particularly preferably, the shield electrode 130 has a shield frequency band, at least, within the range of not less than 1 MHz and not more than 2 GHz.

The shield electrode 130 forms one arbitrary wiring layer 122 among the first to third wiring layers 122A to 123C in the multilayer wiring structure 123, and is arranged on an arbitrary interlayer insulation layer 121. In this embodiment, the shield electrode 130 forms one uppermost third wiring layers 122C in the multilayer wiring structure 123, and is arranged on the uppermost third interlayer insulation layer 121C.

In this embodiment, the shield electrode 130 conceals the constant current region 105, the input regions 106, the amplification regions 107, and the output regions 108. In detail, the shield electrode 130 integrally includes the first shield electrode 131 that conceals the constant current region 105, the second shield electrodes 132 that conceal the input regions 106, the third shield electrodes 133 that conceal the amplification regions 107, and the fourth shield electrodes 134 that conceal the output regions 108.

The first shield electrode 131 intercepts electromagnetic waves from the outside toward the constant current region 105, and restrains a noise and a malfunction in the constant current region 105. Preferably, the first shield electrode 131 conceals the whole area of the constant current region 105.

The second shield electrodes 132 include the second shield electrode 132A that conceals the first input region 106A and the second shield electrode 132B that conceals the second input region 106B. Each of the second shield electrodes 132 intercepts electromagnetic waves from the outside toward the input region 106 corresponding thereto, and restrains a noise and a malfunction in the input region 106 corresponding thereto. Preferably, each of the second shield electrodes 132 conceals the whole area of the input region 106 corresponding thereto.

The third shield electrodes 133 include the third shield electrode 133A that conceals the first amplification region 107A and the third shield electrode 133B that conceals the second amplification region 107B. Each of the third shield electrodes 133 intercepts electromagnetic waves from the outside toward the amplification region 107 corresponding thereto, and restrains a noise and a malfunction in the amplification region 107 corresponding thereto. Preferably, each of the third shield electrodes 133 conceals the whole area of the amplification region 107 corresponding thereto.

The fourth shield electrodes 134 include the fourth shield electrode 134A that conceals the first output region 108A and the fourth shield electrode 134B that conceals the second output region 108B. Each of the fourth shield electrodes 134 intercepts electromagnetic waves from the outside toward the output region 108 corresponding thereto, and restrains a noise and a malfunction in the output region 108 corresponding thereto. Preferably, each of the fourth shield electrodes 134 conceals the whole area of the output region 108 corresponding thereto.

In this embodiment, the first shield electrode 131, the second shield electrodes 132, and the third shield electrodes 133 form a differential amplification shield electrode 135 that collectively conceals the differential amplification region 109 including the constant current region 105, the input regions 106, and the amplification regions 107. On the other hand, the fourth shield electrodes 134 form the output shield electrode 136 that conceals the output regions 108.

The shield electrode 130 includes the shield connection portion 137 that extends toward the low-potential terminal 24 and that is electrically connected to the low-potential terminal 24. The shield connection portion 137 is merely required to be connected to the low-potential terminal 24, and is drawn around in an arbitrary manner. In this embodiment, the shield electrode 130 is formed integrally with the low-potential terminal 24, and is fixed to the ground potential. In other words, the shield electrode 130 forms the single uppermost third wiring layer 122C with the low-potential terminal 24.

As thus described, the first differential amplifier 21A is concealed by a portion in which the first shield electrode 131, the second shield electrode 132A, the third shield electrode 133A, and the fourth shield electrode 134A are integrated with each other. Also, the second differential amplifier 21B is concealed by a portion in which the first shield electrode 131, the second shield electrode 132B, the third shield electrode 133B, and the fourth shield electrode 134B are integrated with each other.

The shield electrode 130 is merely required to include at least one among the first to fourth shield electrodes 131 to 134, and is not necessarily required to include all of the first to fourth shield electrodes 131 to 134. Preferably, the shield electrode 130 has at least either one of the first shield electrode 131, which conceals the constant current region 105, and the second shield electrodes 132, which conceal the input regions 106, among the first to fourth shield electrodes 131 to 134.

In this case, particularly preferably, the shield electrode 130 has both the first shield electrode 131 and the second shield electrodes 132. Most preferably, the shield electrode 130 includes all of the first to fourth shield electrodes 131 to 134. Also, the first to fourth shield electrodes 131 to 134 are merely required to be fixed to the ground potential, and are not necessarily required to be formed integrally. At least one among the first to fourth shield electrodes 131 to 134 may be formed as a structurally independent shield electrode.

The shield electrode 130 includes the through-holes 138 that expose the lower insulation layer 120, which are not concretely shown, in the same way as the semiconductor device 1 according to the first embodiment (also see FIG. 8A and FIG. 8B). The structure of the through-holes 138 is similar to that of the through-holes 138 according to the first embodiment, and therefore a description of the through-holes 138 is omitted.

Referring again to FIG. 15, the semiconductor device 201 includes the protective layer 140 (the inorganic insulation film 142 and the organic insulation film 143) covering the insulation layer 120 (the multilayer wiring structure 123) in the same way as the semiconductor device 1 according to the first embodiment. The protective layer 140 covers the whole area of the shield electrode 130, and has the pad openings 141 in a region outside the shield electrode 130.

The pad openings 141 expose a part of the high-potential terminal 23, a part of the low-potential terminal 24, a part of the first non-inverting input terminal 25A, a part of the second non-inverting input terminal 25B, a part of the first inverting input terminal 26A, a part of the second inverting input terminal 26B, a part of the first output terminal 27A, and a part of the second output terminal 27B such as to serve as a pad portion. The other structures of the protective layer 140 are the same as the protective layer 140 according to the first embodiment, and therefore a description of those structures is omitted.

As described above, a structure, such as the semiconductor device 201, including the differential amplifiers 21 is likewise enabled to fulfill the same effect as the effect described with respect to the semiconductor device 1 according to the first embodiment.

Figure 17:
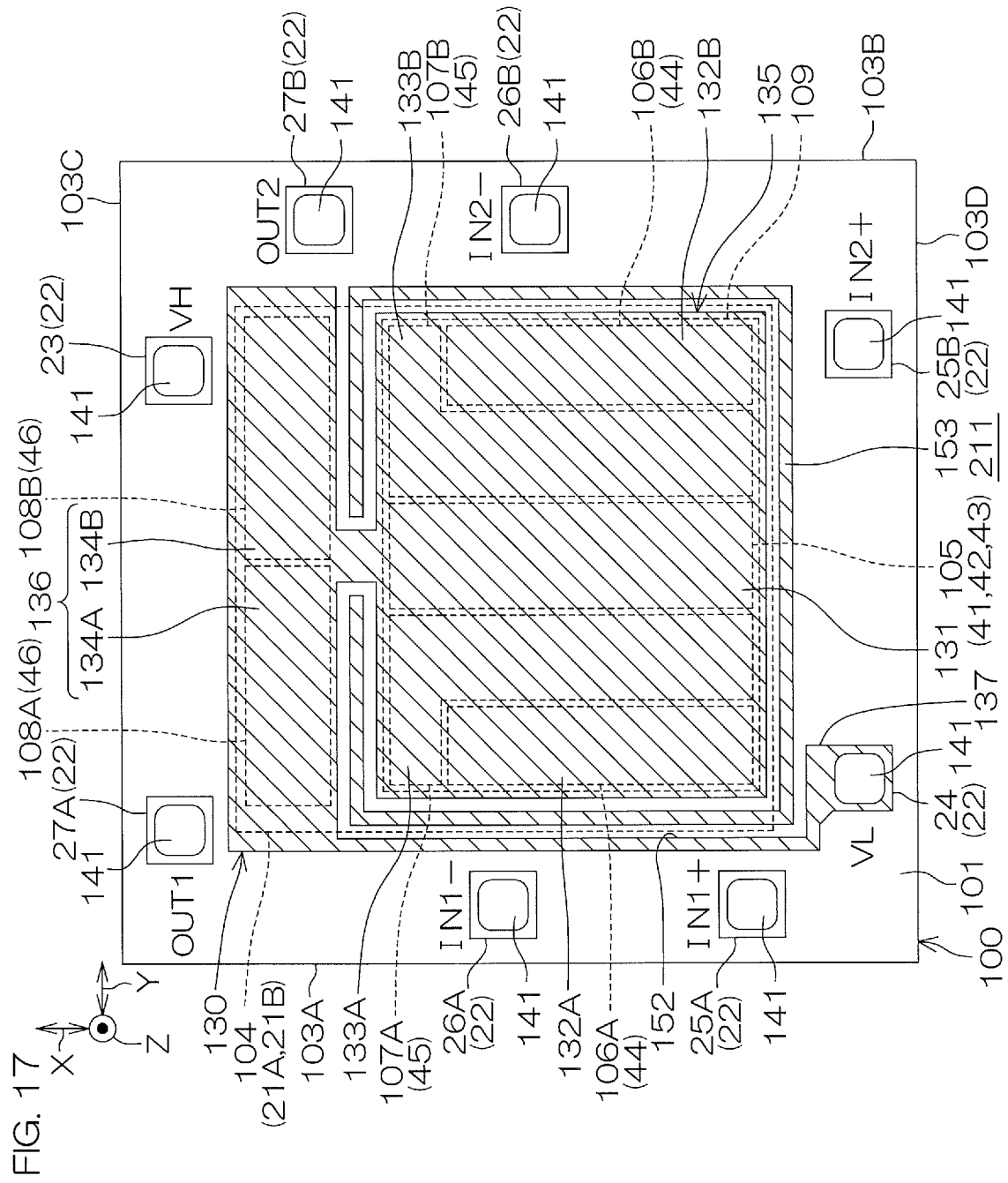
FIG. 17 is a plan view corresponding to FIG. 16, and is a plan view to describe a structure of a semiconductor device according to a fourth embodiment of the present invention.

FIG. 17 is a plan view corresponding to FIG. 16, and is a plan view to describe a structure of a semiconductor device 211 according to a fourth embodiment of the present invention. The same reference sign is hereinafter given to a constituent equivalent to each constituent described with respect to the semiconductor device 201, and a description of the constituent is omitted.

Referring to FIG. 17, the semiconductor device 211 includes the slit 152 that fringes the differential amplification shield electrode 135 in the shield electrode 130. The slit 152 defines the differential amplification region 109 including the constant current region 105, the input region 106, and the amplification region 107 from the outside in a plan view. The slit 152 extends in the shape of the capital letter C in a plan view such as to allow a connection portion between the differential amplification shield electrode 135 and the output shield electrode 136 to remain.

The semiconductor device 211 includes the guard electrode 153 that is formed along the perimeter of the differential amplification shield electrode 135 at a distance from the differential amplification shield electrode 135, and is fixed to the ground potential. The guard electrode 153 forms one uppermost third wiring layer 122C in the multilayer wiring structure 123, and is arranged on the uppermost third interlayer insulation layer 121C. The guard electrode 153 is formed in a belt shape extending along the differential amplification shield electrode 135 such as to divisionally form the differential amplification shield electrode 135 from the outside in a plan view. The guard electrode 153 extends in the shape of the capital letter C in a plan view.

The guard electrode 153 is formed independently of (separately from) the low-potential terminal 24 and the shield electrode 130 on the third interlayer insulation layer 121C. In this embodiment, the guard electrode 153 is electrically connected to the low-potential terminal 24 through an arbitrary one of the first and second wiring layers 122A and 122B and through an arbitrary one of the first to third via electrodes 124 to 126. Of course, the guard electrode 153 may include a connection portion electrically connected to the low-potential terminal 24 on the third interlayer insulation layer 121C. In other words, the guard electrode 153 may be formed integrally with the low-potential terminal 24 and with the shield electrode 130.

As described above, the semiconductor device 211 is likewise enabled to fulfill the same effect as the effect described with respect to the semiconductor device 1. Also, the semiconductor device 211 includes the guard electrode 153 formed in a belt shape along the differential amplification shield electrode 135. Hence, when an ESD surge voltage is applied to any one of the high-potential terminal 23, the low-potential terminal 24, the non-inverting input terminals 25, the inverting input terminals 26, and the output terminals 27, it is possible to absorb this ESD surge voltage by means of the guard electrode 153. As a result, it is possible to improve electrostatic breakdown resistance.

The embodiment of the present invention can be carried out in other modes.

In each of the embodiments mentioned above, various transistors included in the differential amplifier 21 (the constant current circuits 41 to 43, the input circuit 44, the amplifier circuit 45, and the output circuit 46) may be formed by use of a CMOS transistor. In other words, the differential amplifier 21 may be a CMOS differential amplifier. The CMOS differential amplifier has the advantage of being low in power consumption and being high in input impedance, and yet the CMOS differential amplifier has the disadvantage of easily making a noise in the CMOS transistor for structural causes. In this respect, it is possible to reduce noise components caused by electromagnetic waves from the outside in the CMOS transistor by concealing the CMOS differential amplifier by means of the shield electrode 130.

In each of the embodiments mentioned above, if there is no problem in the design rule of the first and second wiring layers 122A and 122B, the shield electrode 130 may be arranged on the interlayer insulation layer (the first and second interlayer insulation layers 121A to 121B) positioned on the lower-layer side of the uppermost interlayer insulation layer (the third interlayer insulation layer 121C).

In each of the embodiments mentioned above, the semiconductor chip 100 may include a p-type (first-conductivity-type) or n-type (second-conductivity-type) semiconductor substrate. Also, the semiconductor chip 100 may include a p-type or n-type epitaxial layer formed on a p-type or n-type semiconductor substrate.

In each of the embodiments mentioned above, the protective layer 140 made of either one of the inorganic insulation film 142 and the organic insulation film 143 may be employed.

The three first to third constant current circuits 41 to 43 are formed as described in the first and second embodiments mentioned above. However, a method in which a constant current is divided and allowed to flow from the single constant current circuit (the first and second constant current generation circuits 47 and 48) to various circuits may be employed instead of the three constant current circuits 41 to 43.

The three first to third constant current circuits 41 to 43 are formed in the single constant current region 105 as described in the first and second embodiments mentioned above. However, the three first to third constant current circuits 41 to 43 may be each formed in two or more constant current regions 105 that are demarcated at a distance from each other in an arbitrary region. In this case, it is recommended to allow each of two or more first shield electrodes 131 to cover the constant current region 105 corresponding thereto.

The high-potential terminal 23 and the low-potential terminal 24 are each formed as a common terminal between the first and second differential amplifiers 21A and 21B as described in the third and fourth embodiments mentioned above. However, a plurality of high-potential terminals 23 may be formed in which a high potential is individually applied to the first and second differential amplifiers 21A and 21B. Also, a plurality of low-potential terminals 24 may be formed in which a low potential is individually applied to the first and second differential amplifiers 21A and 21B.

The three first to third constant current circuits 41 to 43 for the first differential amplifier 21A and the three first to third constant current circuits 41 to 43 for the second differential amplifier 21B are formed as described in the third and fourth embodiments mentioned above. However, a method in which a constant current is divided and allowed to flow from the single constant current circuit (the first and second constant current generation circuits 47 and 48) to various circuits of the first and second differential amplifiers 21A and 21B may be employed instead of the six constant current circuits 41 to 43.

The three first to third constant current circuits 41 to 43 for the first differential amplifier 21A and the three first to third constant current circuits 41 to 43 for the second differential amplifier 21B are formed as described in the third and fourth embodiments mentioned above. However, the six first to third constant current circuits 41 to 43 may be each formed in two or more constant current regions 105 that are demarcated at a distance from each other in an arbitrary region. For example, the constant current region 105 for the first differential amplifier 21A and the constant current region 105 for the second differential amplifier 21B may be demarcated at a distance from each other in an arbitrary region. In these cases, it is recommended to allow each of two or more first shield electrodes 131 to cover the constant current region 105 corresponding thereto.

In the semiconductor package 202, the die pad 7 is formed in an electrically floating state as described in the third and fourth embodiments mentioned above. However, a mode in which the die pad 7 is fixed to the ground potential may be employed in the semiconductor package 202 in the same way as the semiconductor package 2 according to the first and second embodiments mentioned above. For example, the inner end portion 17 of the low-potential lead terminal 13 according to the semiconductor package 202 may be formed integrally with the die pad 7, and may fix the die pad 7 to the same potential. In this case, the die pad 7 may be used also as a shield plate that intercepts electromagnetic waves from the outside.

Figure 18:
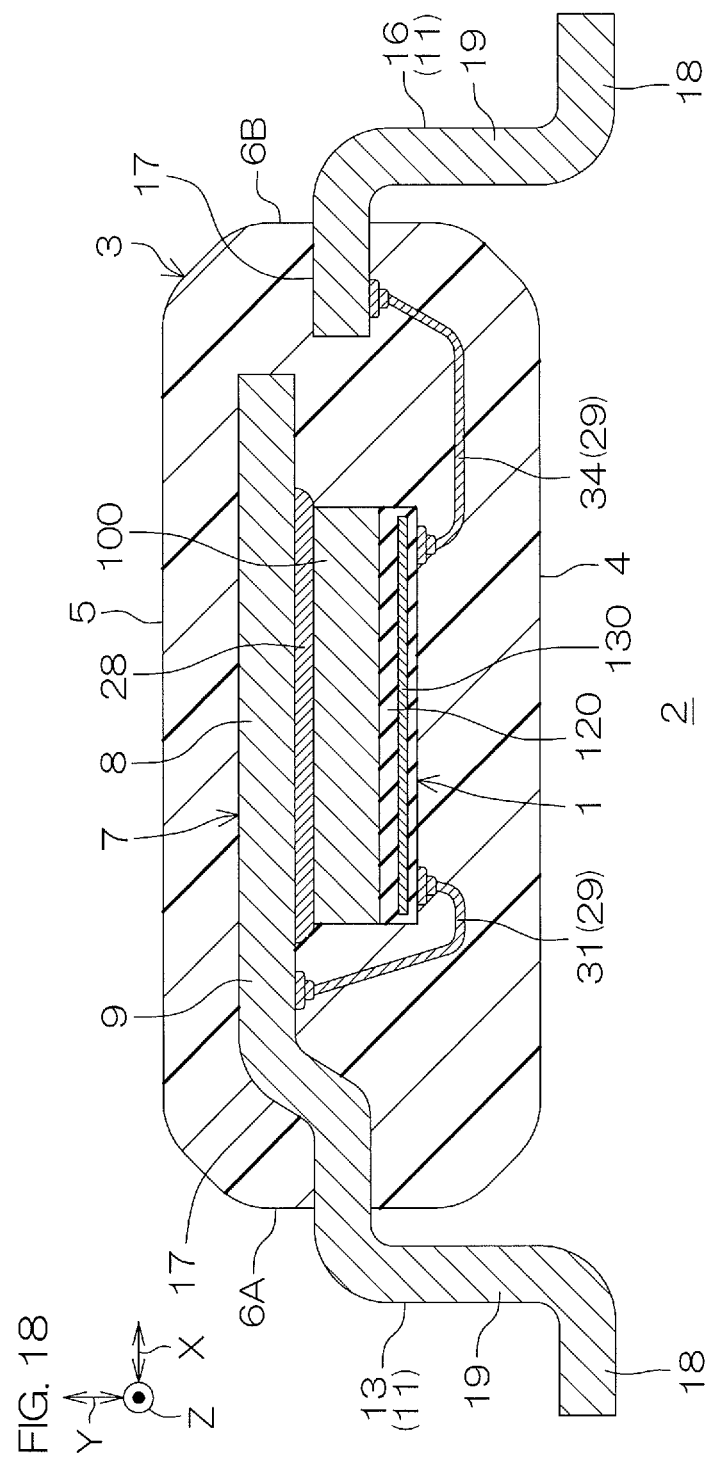
FIG. 18 is a cross-sectional view showing a modification of the semiconductor package shown in FIG. 1.

In the first and second embodiments mentioned above, a semiconductor package 2 shown in FIG. 18 may be employed. FIG. 18 is a cross-sectional view showing a modification of the semiconductor package 2 shown in FIG. 1.

Referring to FIG. 18, the die pad 7 is arranged on the non-mounting-surface-5 side in the package body 3. The lead terminals 11 are bent toward the mounting-surface-4 side outside the package body 3. The semiconductor device 1 is arranged on the mounting-surface-4 side of the package body 3 with respect to the die pad 7 in the package body 3. The semiconductor device 1 is arranged on a plate surface on the mounting-surface-4 side of the die pad 7 in a posture in which the terminals 22 are allowed to face the mounting surface 4 of the package body 3.

Each of the lead wires 29 connects the lead terminal 11 corresponding thereto to the terminal 22 corresponding thereto in the same way as the semiconductor package 2 according to the first embodiment. Hence, the die pad 7 and the shield electrode 130 are fixed to the ground potential.

The thus formed semiconductor package 2 is likewise enabled to improve the EMI immunity of the semiconductor device 1 in a state of being mounted in the semiconductor package 2. The shield electrode 130 may be excluded from the semiconductor device 1 if the influence of electromagnetic waves from the to-be-connected-object side is slight in a state in which the semiconductor package 2 has been mounted on the to-be-connected object. A case in which an electromagnetic shield that intercepts electromagnetic waves from the outside is included in the to-be-connected object or a similar case can be mentioned as an example of a case in which the influence of electromagnetic waves from the to-be-connected-object side is slight. The structure of the semiconductor package 2 according to the modification is applicable also to the semiconductor package 202 according to the third and fourth embodiments.

This application corresponds to Japanese Patent Application No. 2019-223029 filed in the Japan Patent Office on Dec. 10, 2019, the entire disclosure of which is incorporated herein by reference. Although the embodiments of the present invention have been described in detail, these embodiments are merely concrete examples used to clarify the technical contents of the present invention, and the present invention should not be understood by being limited to these concrete examples, and the scope of the present invention is limited by the appended Claims.

REFERENCE SIGNS LIST

1 Semiconductor device
21 Differential amplifier
24 Low-potential terminal (Ground terminal)
41 First constant current circuit
42 Second constant current circuit
43 Third constant current circuit
44 Input circuit
45 Amplifier circuit
46 Output circuit
49 First current mirror circuit
50 Second current mirror circuit
55 Third current mirror circuit
56 Fourth current mirror circuit
61 First differential circuit
62 Second differential circuit
63A First differential transistor
63B First differential transistor
64A Second differential transistor
64B Second differential transistor
71 First current return circuit
72 Second current return circuit
73 Class-AB control circuit
74A First bias transistor
74B First bias transistor
75A Second bias transistor
75B Second bias transistor
81A Output transistor
81B Output transistor 82 Push-pull circuit
100 Semiconductor chip
101 First main surface
104 Device region
105 Constant current region
106 Input region
107 Amplification region
108 Output region
120 Insulation layer
121 Interlayer insulation layer
122 Wiring layer
123 Multilayer wiring layer
130 Shield electrode
138 Through-hole
140 Protective layer
142 Inorganic insulation film
143 Organic insulation film
151 Semiconductor device
201 Semiconductor device
211 Semiconductor device

The invention claimed is:

1. A semiconductor device comprising:
a semiconductor chip that has a main surface;
a device region that is demarcated at the main surface;
an amplifier that is formed in the device region and that amplifies and outputs a differential signal input into the amplifier;
a multilayer wiring layer in which interlayer insulation layers and wiring layers are alternately laminated, wherein
the multilayer wiring layer covers the device region on the main surface,
the multilayer wiring layer includes an uppermost wiring layer of the wiring layers that is arranged on an uppermost insulation layer of the interlayer insulation layers, and
the multilayer wiring layer has a ground terminal to be fixed to a ground potential;
a shield electrode that is incorporated in the multilayer wiring layer as a part of the uppermost wiring layer so as to be integrally formed with the ground terminal and conceal the device region in a plan view; and
a protective layer that covers the shield electrode and that has a pad opening that exposes a part of the ground terminal.

2. The semiconductor device according to claim 1, wherein the protective layer includes at least either one of an inorganic insulation film and an organic insulation film.

3. The semiconductor device according to claim 1, wherein the shield electrode includes a plurality of through-holes.

4. The semiconductor device according to claim 3, wherein each of the through-holes has a size smaller than a wavelength of an electromagnetic wave that is to be intercepted.

5. The semiconductor device according to claim 3, wherein the through-holes are arranged in a staggered pattern in a plan view, or in a matrix pattern in a plan view, or in a concentric circle pattern in a plan view.

6. The semiconductor device according to claim 1, wherein the shield electrode includes an Al-based metal film.

7. The semiconductor device according to claim 1, wherein
the amplifier is a differential amplifier, and
the signal input into the differential amplifier is a differential signal.

8. The semiconductor device according to claim 7, wherein
the device region includes an input region, an amplification region, and an output region,
the differential amplifier includes an input circuit that is formed in the input region and that transforms the differential signal into a differential current, an amplifier circuit that is formed in the amplification region and that amplifies the differential current and generates an amplification current, and an output circuit that is formed in the output region and that generates an output current according to the amplification current, and
the shield electrode conceals the input region.

9. The semiconductor device according to claim 8, wherein the shield electrode conceals the input region, the amplification region, and the output region.

10. The semiconductor device according to claim 8, wherein
the input circuit includes a differential circuit including a pair of differential transistors forming a differential connection,
the amplifier circuit includes a current return circuit that forms a cascode connection with the differential circuit and that includes a pair of bias transistors forming a folded cascode circuit with the differential circuit, and
the output circuit includes a push-pull circuit including a pair of output transistors forming a push-pull connection.

11. The semiconductor device according to claim 10, wherein
the amplifier circuit includes a class-AB control circuit that is connected to the current return circuit and that generates a class-AB control signal according to the amplification current generated by the current return circuit, and
the push-pull circuit is connected to the class-AB control circuit, and generates the output current according to the amplification current in response to the class-AB control signal.

12. The semiconductor device according to claim 10, wherein
the device region includes a constant current region,
the differential amplifier includes a constant current circuit that is formed in the constant current region and that generates a constant current,
the differential circuit of the input circuit is connected to the constant current circuit, and
the shield electrode covers the constant current region.

13. The semiconductor device according to claim 12, wherein the constant current circuit includes a current mirror circuit.

14. A semiconductor device comprising:
a semiconductor chip that has a main surface;
a constant current region that is demarcated at the main surface;
an input region that is demarcated at the main surface;
a constant current circuit that is formed in the constant current region and that generates a constant current;
a differential circuit that is formed in the input region, that is electrically connected to the constant current circuit, and that transforms a differential signal input to the differential circuit into a differential current; and
a shield electrode that is arranged on the main surface such as to conceal at least either one of the input region and the constant current region in a plan view and that is fixed to a ground potential.

15. The semiconductor device according to claim 14, wherein
the constant current circuit includes a current mirror circuit, and
the differential circuit includes a pair of differential transistors forming a differential connection.

16. The semiconductor device according to claim 14, further comprising:
an insulation layer that covers the input region and the constant current region on the main surface;
wherein the shield electrode is incorporated in the insulation layer.

17. A semiconductor device comprising:
a semiconductor chip that has a main surface;
a device region that is demarcated at the main surface, the device region including an input region, an amplification region, and an output region;
a differential amplifier that is formed in the device region and that amplifies and outputs a differential signal input into the differential amplifier, the differential amplifier including an input circuit that is formed in the input region and that transforms the differential signal into a differential current, an amplifier circuit that is formed in the amplification region and that amplifies the differential current and generates an amplification current, and an output circuit that is formed in the output region and that generates an output current according to the amplification current; and
a shield electrode that is arranged on the main surface such as to conceal the input region of the device region in a plan view and that is fixed to a ground potential;
wherein the input circuit includes a differential circuit including a pair of differential transistors forming a differential connection,
the amplifier circuit includes a current return circuit that forms a cascode connection with the differential circuit and that includes a pair of bias transistors forming a folded cascode circuit with the differential circuit, and
the output circuit includes a push-pull circuit including a pair of output transistors forming a push-pull connection.

18. The semiconductor device according to claim 17, wherein
the amplifier circuit includes a class-AB control circuit that is connected to the current return circuit and that generates a class-AB control signal according to the amplification current generated by the current return circuit, and
the push-pull circuit is connected to the class-AB control circuit, and generates the output current according to the amplification current in response to the class-AB control signal.

19. The semiconductor device according to claim 17, further comprising:
an insulation layer that covers the device region on the main surface;
wherein the shield electrode is incorporated in the insulation layer.

20. The semiconductor device according to claim 19, wherein
the insulation layer is a multilayer wiring layer in which interlayer insulation layers and wiring layers are alternately laminated together, and
the shield electrode forms a part of an arbitrary wiring layer of the wiring layers.

* * * * *